(12) United States Patent
Ikebuchi

(10) Patent No.: US 10,128,250 B2
(45) Date of Patent: Nov. 13, 2018

(54) SEMICONDUCTOR DEVICE AND MANUFACTURING METHOD THEREOF

(71) Applicant: PS4 Luxco S.a.r.l., Luxembourg (LU)

(72) Inventor: Yoshinori Ikebuchi, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 0 days.

(21) Appl. No.: 14/781,149

(22) PCT Filed: Mar. 26, 2014

(86) PCT No.: PCT/JP2014/058420
§ 371 (c)(1),
(2) Date: Sep. 29, 2015

(87) PCT Pub. No.: WO2014/162937
PCT Pub. Date: Oct. 9, 2014

(65) Prior Publication Data
US 2016/0043090 A1    Feb. 11, 2016

(30) Foreign Application Priority Data

Apr. 1, 2013   (JP) ................................ 2013-076264

(51) Int. Cl.
*H01L 27/108*   (2006.01)
*H01L 21/76*    (2006.01)
(Continued)

(52) U.S. Cl.
CPC ...... *H01L 27/10876* (2013.01); *H01L 21/308* (2013.01); *H01L 21/31111* (2013.01);
(Continued)

(58) Field of Classification Search
CPC ................... H01L 27/10891; H01L 27/10876
See application file for complete search history.

(56) References Cited

U.S. PATENT DOCUMENTS

2008/0253160 A1    10/2008  Popp et al.
2011/0266647 A1    11/2011  Parekh et al.
(Continued)

OTHER PUBLICATIONS

Application No. PCT/JP2014/058420, International Search Report, dated Jun. 24, 2014.

*Primary Examiner* — Jose R Diaz
(74) *Attorney, Agent, or Firm* — Kunzler, PC

(57) ABSTRACT

One method for manufacturing a semiconductor device includes: forming provisional active regions that are shaped such that active regions that are adjacent in an X direction are connected to each other, forming a sacrificial film, performing etching, including the sacrificial film, so as to form a plurality of first trenches that separate the active regions, embedding element-isolating insulating films in the first trenches and then removing the sacrificial film, forming first side-wall insulating films that cover the exposed side surfaces of the element-isolating insulating films and second side-wall insulating films that cover the side surfaces of the first side-wall insulating films, embedding cap insulating films in second trenches that appear due to the formation of the second side-wall insulating films, and forming a plurality of third trenches at the positions of the second side-wall insulating films and forming word lines thereunder.

4 Claims, 28 Drawing Sheets

(51) Int. Cl.
  *H01L 21/308* (2006.01)
  *H01L 21/311* (2006.01)
  *H01L 21/762* (2006.01)
  *H01L 29/06* (2006.01)
  *H01L 27/02* (2006.01)

(52) U.S. Cl.
  CPC ........ *H01L 21/31144* (2013.01); *H01L 21/76* (2013.01); *H01L 21/76224* (2013.01); *H01L 27/10814* (2013.01); *H01L 27/10823* (2013.01); *H01L 27/10885* (2013.01); *H01L 27/10888* (2013.01); *H01L 27/10891* (2013.01); *H01L 27/10894* (2013.01); *H01L 29/0649* (2013.01); *H01L 27/0207* (2013.01)

(56) References Cited

U.S. PATENT DOCUMENTS

| | | |
|---|---|---|
| 2012/0161227 A1 | 6/2012 | Oyu |
| 2012/0273859 A1 | 11/2012 | Oyu et al. |
| 2012/0286358 A1 | 11/2012 | Sammi |
| 2014/0061742 A1* | 3/2014 | Nishitani .......... H01L 27/10814 257/296 |

* cited by examiner (a)

(c)

(b)

(d)

(a)

(c)

(b)

(d)

(a)

(c)

(b)

(d)

(a)

(c)

(b)

(d)

(a)

(c)

(b)

(d)

(a)

(c)

(b)

(d)

(a)

(c)

(b)

(d)

(a)

(c)

(b)

(d)

SEMICONDUCTOR DEVICE AND MANUFACTURING METHOD THEREOF

TECHNICAL FIELD

The present invention relates to a semiconductor device and a method of manufacturing the same, and in particular relates to a semiconductor device in which word lines formed embedded in a semiconductor substrate and element isolation regions extending in the word line direction are formed in mutual self-alignment, and a method of manufacturing the same.

BACKGROUND ART

In semiconductor devices such as DRAMs (Dynamic Random Access Memory), element isolation regions are provided in the surface of a silicon substrate using STI (shallow trench isolation), and these demarcate a plurality of active regions in a matrix formation. The element isolation regions include first element isolation regions which isolate the active regions in a bit line direction, and second element isolation regions which isolate the active regions in a word line direction. Patent literature article 1 discloses examples of such element isolation regions and active regions.

Patent Literature

Patent literature article 1: Japanese Patent Kokai 2012-134395

SUMMARY OF THE INVENTION

Problems to be Resolved by the Invention

However, in the semiconductor device described in patent literature article 1, the word lines are formed from a conductive film embedded in the semiconductor substrate, and the word lines (embedded word lines) and the first element isolation regions (element isolation regions extending in the word line direction) are formed in mutual self-alignment. This point will be described in more detail hereinafter. It should be noted that in the following description, the respective widths, in the bit line direction, of the word lines and the first element isolation regions are W1 and W3, conforming with patent literature article 1. Further, the distance in the bit line direction between a certain first element isolation region and the word line closest to said first element isolation region is W2. Further, the distance between two word lines passing through the same active region is W4.

In the method described in patent literature article 1, the main surface of the semiconductor substrate is first covered by a plurality of linear mask patterns, each extending in the word line direction. The width of the linear mask pattern in the bit line direction is 2W2−W3, and the distance between adjacent mask patterns is set to 2W1+W4. First side-wall insulating films having a thickness W1 in the bit line direction are then formed on the side walls of the linear mask pattern, and the linear mask pattern is then removed. The first side-wall insulating films formed in this way form a pattern of insulating films covering only the regions in which the word lines are to be embedded. Second side-wall insulating films having a thickness W2 in the bit line direction are then formed on the side walls of the first side-wall insulating films, after which the first side-wall insulating films are removed. The second side-wall insulating films formed in this way form a pattern of insulating films having openings exposing the regions in which the element isolation regions are to be embedded, and the regions in which the word lines are to be embedded. Therefore by etching the main surface of the semiconductor substrate, using the second side-wall insulating films as a mask, it is possible to form trenches for embedding each of the element isolation regions and word lines. The word lines and the first element isolation regions are then formed by covering the inner surfaces of the formed trenches with a thin insulating film, and embedding a conductive film in the trenches.

According to the forming method described hereinabove, the respective locations of the word lines and the first element isolation regions in the bit line direction are defined accurately in accordance with the location in which the linear mask pattern, which is formed first, is formed. If, as in this example, the relative locations of two types of embedded film are determined in accordance with the location in which a common pattern is formed, this is described in the present specification as the two types of embedded film being formed in mutual self-alignment.

However, according to the method described in patent literature article 1, not only the word lines, but also the first element isolation regions are formed using the conductive film. First element isolation regions formed in this way employ what is known as electric-field shielding, and in order for these to exhibit an element-isolating function, a certain voltage must be applied continuously at all times. A control circuit is therefore required in order to apply this voltage, thereby complicating the circuit.

Means of Overcoming the Problems

A method of manufacturing a semiconductor device according to the present invention is characterized in that it comprises: a step of embedding a first insulating film for element isolation in a main surface of a semiconductor substrate to form a plurality of provisional active regions which extend in a first direction and are disposed in a repeating manner in a second direction which intersects said first direction; a step of forming a sacrificial film covering the main surface; a step of etching the first insulating film for element isolation, the sacrificial film and the semiconductor substrate to form a plurality of first trenches demarcating a plurality of first active regions which are obtained by dividing each of the plurality of provisional active regions in the first direction; a step of embedding second insulating films for element isolation into the plurality of first trenches; a step of removing the sacrificial film after the second insulating films for element isolation have been embedded into the plurality of first trenches; a step of forming first side-wall insulating films covering side surfaces of parts of the second insulating films for element isolation, said parts projecting from an obverse surface of the main surface, after the sacrificial film has been removed; a step of forming second side-wall insulating films covering side surfaces of the first side-wall insulating films; a step of embedding cap insulating films into a plurality of second trenches which appear as a result of the formation of the second side-wall insulating films; a step of forming a plurality of third trenches by removing the second side-wall insulating films while allowing the second insulating films for element isolation, the cap insulating films and the first side-wall insulating films to remain, and etching the semiconductor substrate using the second insulating films for element isolation, the cap insulating films and the first side-wall insulating films as a mask; and a step of forming first wiring lines by forming first gate insulating films covering the inner surfaces of each of the plurality of third trenches, and embedding a first conductive film into a lower portion of each of the plurality of third trenches.

A semiconductor device according to the present invention is characterized in that it is provided with: a semiconductor substrate; a plurality of first insulating films for element isolation, each of which is embedded in a main surface of the semiconductor substrate and extends in a first direction; a plurality of second insulating films for element isolation, each of which is embedded in the main surface of the semiconductor substrate and extends in a second direction intersecting the first direction, and which, in conjunction with the plurality of first insulating films for element isolation, demarcate a plurality of first active regions disposed in a matrix formation; first and second word trenches which are provided extending in the second direction in the main surface of the semiconductor substrate, and which are disposed between two of the plurality of second insulating films for element isolation that are adjacent to one another in the first direction; first and second word lines, embedded respectively in lower portions of the first and second word trenches, with the interposition of gate insulating films; first impurity-diffused layers provided between the first word lines and the second word lines; second impurity-diffused layers provided between the first word lines and one of said two second insulating films for element isolation; and third impurity-diffused layers provided between the second word lines and the other of said two second insulating films for element isolation; and in that the first and second word trenches are formed in self-alignment relative to the plurality of second insulating films for element isolation.

Advantages of the Invention

According to the present invention, element isolation regions that are self-aligned with first wiring lines (word lines) are formed from insulating films (second insulating films for element isolation), and it is therefore not necessary to apply a voltage to the element isolation regions. The circuit can therefore be simplified.

MODES OF EMBODYING THE INVENTION

Figure 1:
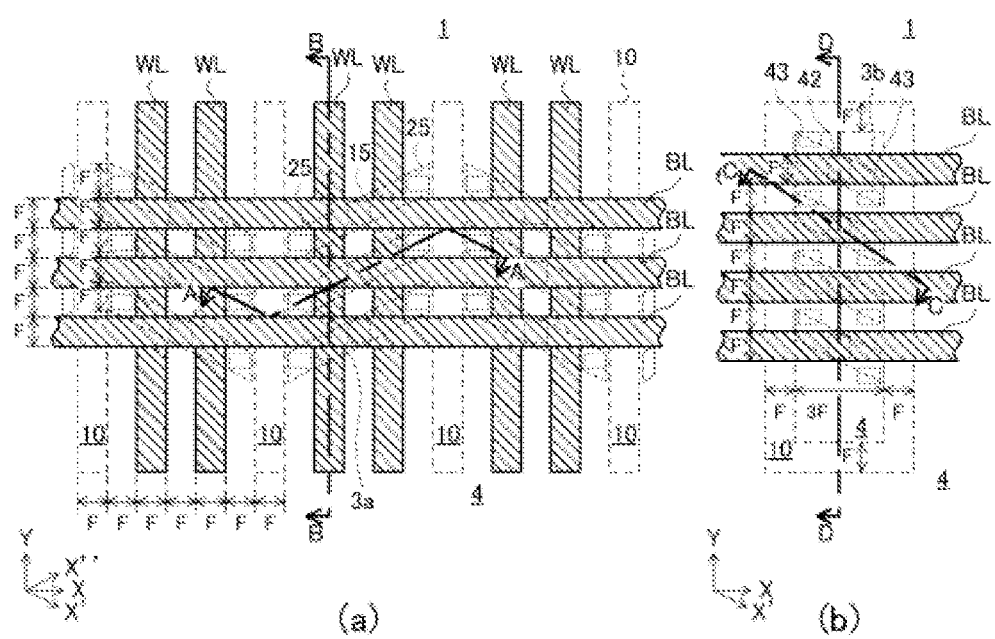
FIG. 1(a) is a plan view of a memory cell region of a semiconductor device 1 according to a preferred mode of embodiment of the present invention, and (b) is a plan view of a peripheral circuit region of the semiconductor device 1.

Preferred modes of embodiment of the present invention will now be described in detail with reference to the accompanying drawings.

The structure of the semiconductor device 1 will first be described with reference to FIGS. 1(a) and (b) and FIGS. 2(a) to (d). It should be noted that a depiction of the configuration above the interlayer insulating film 30 discussed hereinafter has been omitted from FIGS. 2(b) and (d).

The semiconductor device 1 is a DRAM comprising a semiconductor substrate 2 (silicon substrate), as illustrated in FIGS. 2(a) to (d). A memory cell region illustrated in FIG. 1(a) and a peripheral circuit region illustrated in FIG. 1(b) are provided on the main surface of the semiconductor substrate 2. The memory cell region is a region in which multiple cell transistors and cell capacitors, which form memory cells, are disposed in a matrix formation. Meanwhile, the peripheral circuit region is a region in which word drivers for driving word lines WL extending within the memory cell region, and column switches for connecting bit lines BL to read/write buses, and the like, are provided.

The structures within the memory cell region will first be described with reference to FIG. 1(a). As illustrated in the drawing, a plurality of active regions 3a (first active regions) are disposed in a matrix formation in the memory cell region. In other words, the plurality of active regions 3a is disposed in a repeating manner in the X-direction (first direction) and the Y-direction (a direction intersecting the X-direction-second direction). The shape of each active region 3a is a parallelogram in which one group of opposing sides is parallel to the Y-direction. With regard to the other group of opposing sides, active regions 3a parallel to an X'-direction which is inclined in the negative direction relative to the X-direction, and active regions 3a parallel to an X"-direction which is inclined in the positive direction relative to the X-direction are disposed alternately as viewed in the X-direction. The shapes of the active regions 3a aligned side-by-side in the Y-direction are the same as one another. It should be noted that FIG. 1(a) illustrates an example in which three active regions 3a are aligned side-by-side in the Y-direction, but this is in order to facilitate understanding of the drawing and to simplify the description, and in practice more active regions 3a are disposed.

Figure 23:
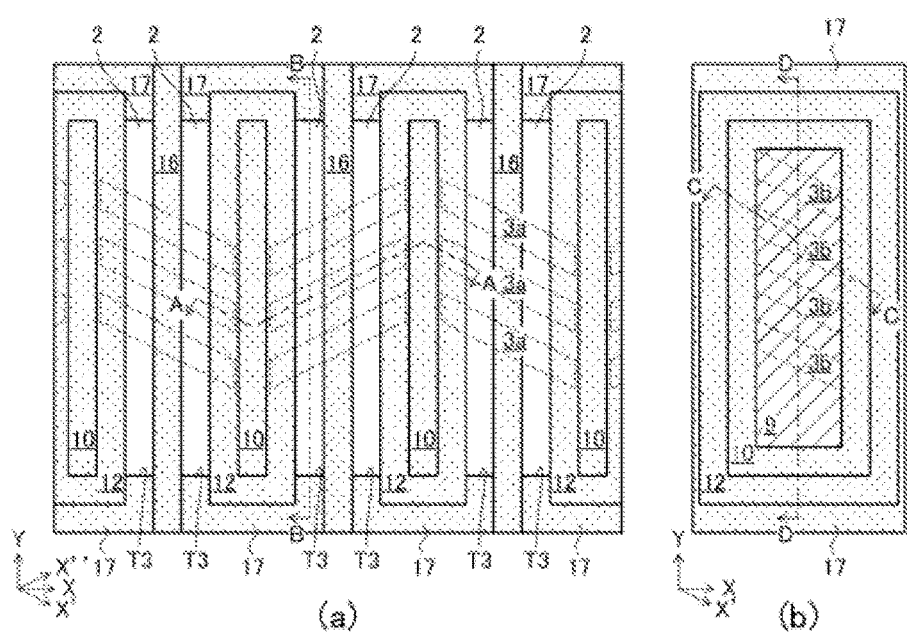
FIGS. 23(a) and (b) are plan views of the semiconductor device 1 as illustrated in FIGS. 1(a) and (b) respectively, during the manufacturing process.

Each active region 3a is demarcated by insulating films for element isolation 4 (first insulating films for element isolation), which are silicon dioxide films extending in the X-direction, and insulating films for element isolation 10 (second insulating films for element isolation), which are silicon nitride films extending in the Y-direction. The insulating films for element isolation 4 and 10 are each embedded in the main surface of the semiconductor substrate 2, and form element isolation regions through STI, discussed hereinabove. Here the insulating films for element isolation 4 are silicon dioxide films, but either silicon dioxide films or silicon nitride films may be used as the insulating films for element isolation 4. Meanwhile, silicon nitride films are preferably employed as the insulating films for element isolation 10. This is in order to allow trenches T3 for embedding the word lines WL (see FIG. 23(a) for example) to be formed suitably in the manufacturing process discussed hereinafter. This point is discussed in detail hereinafter.

In the example in FIG. 1(a), the spacing between the insulating films for element isolation 10 adjacent to one another in the X-direction is five times the minimum lithography processing dimension F (5F). Therefore the width, in the X-direction, of the active regions 3a is 5F. Further, the width, in the X-direction, of the insulating films for element isolation 10 is F, and therefore the spacing between the active regions 3a adjacent to one another in the X-direction is F. Moreover, the spacing between the insulating films for element isolation 4 adjacent to one another in the Y-direction is F, and therefore the width, in the Y-direction, of the active regions 3a is F. Further, the width, in the Y-direction, of the insulating films for element isolation 4 between the active regions 3a is F, and therefore the spacing between the active regions 3a adjacent to one another in the Y-direction is F.

A plurality of word lines WL, each extending in the Y-direction, and a plurality of bit lines BL, each extending in the X-direction, are disposed in the memory cell region.

Figure 2:
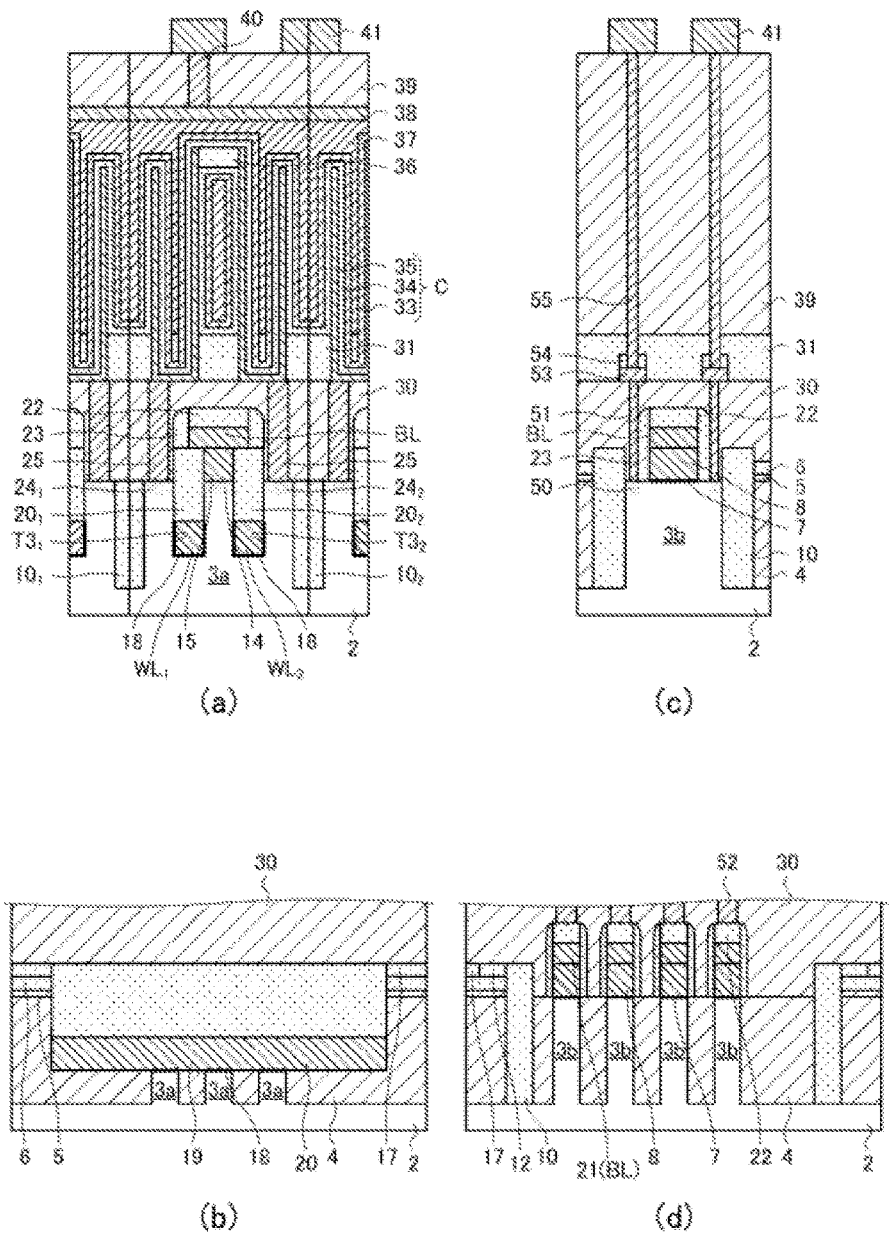
FIGS. 2(a) and (b) are cross-sectional views of the semiconductor device 1, corresponding respectively to the line A-A and the line B-B in FIGS. 1(a), and (c) and (d) are cross-sectional views of the semiconductor device 1, corresponding respectively to the line C-C and the line D-D in FIG. 1(b).
Figure 3:
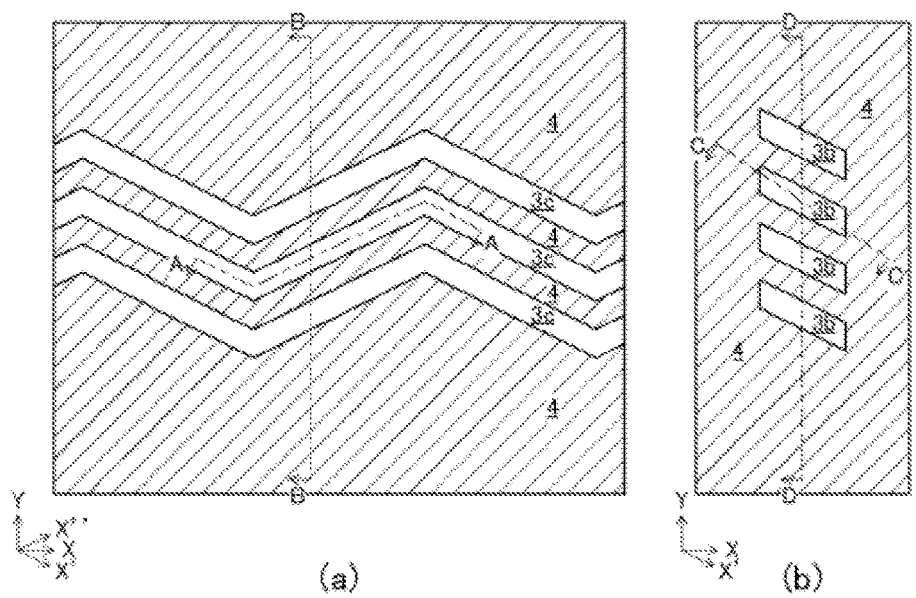
FIGS. 3(a) and (b) are plan views of the semiconductor device 1 as illustrated in FIGS. 1(a) and (b) respectively, during the manufacturing process.
Figure 4:
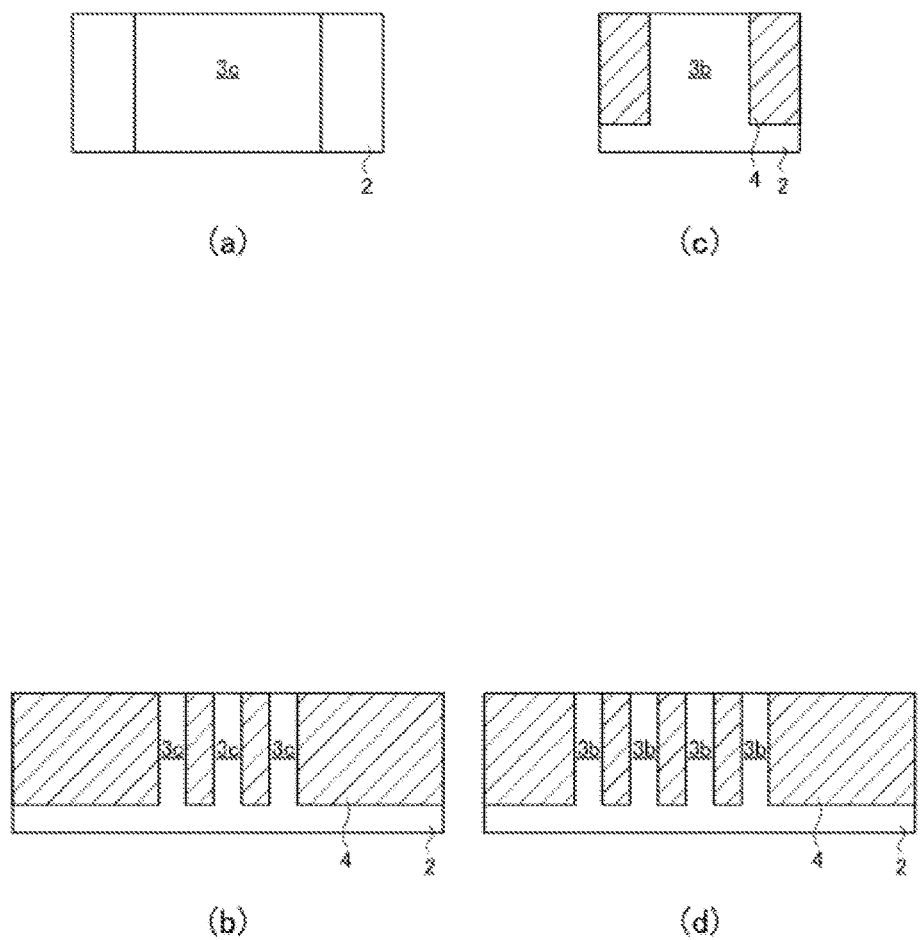
FIGS. 4(a) and (b) are cross-sectional views of the semiconductor device 1, corresponding respectively to the line A-A and the line B-B in FIGS. 3(a), and (c) and (d) are cross-sectional views of the semiconductor device 1, corresponding respectively to the line C-C and the line D-D in FIG. 3(b).
Figure 5:
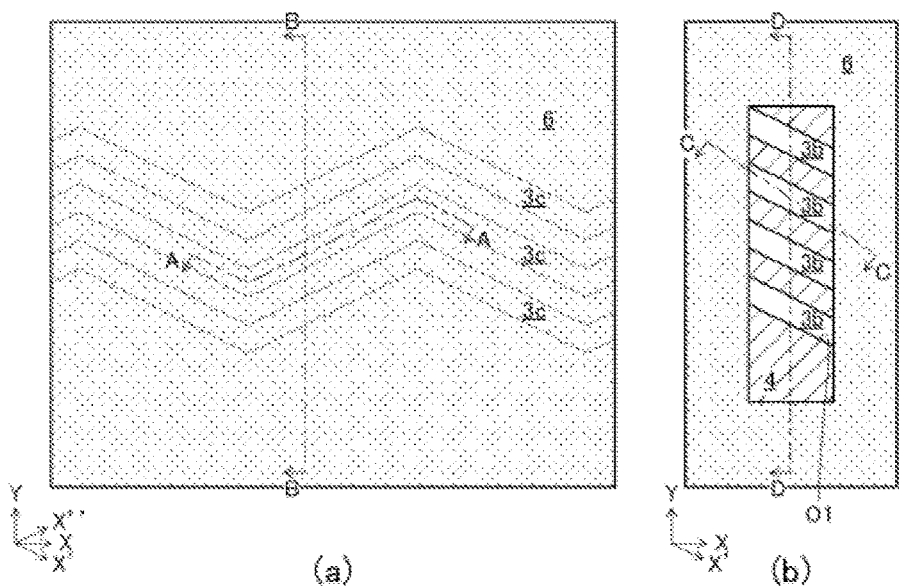
FIGS. 5(a) and (b) are plan views of the semiconductor device 1 as illustrated in FIGS. 1(a) and (b) respectively, during the manufacturing process.
Figure 6:
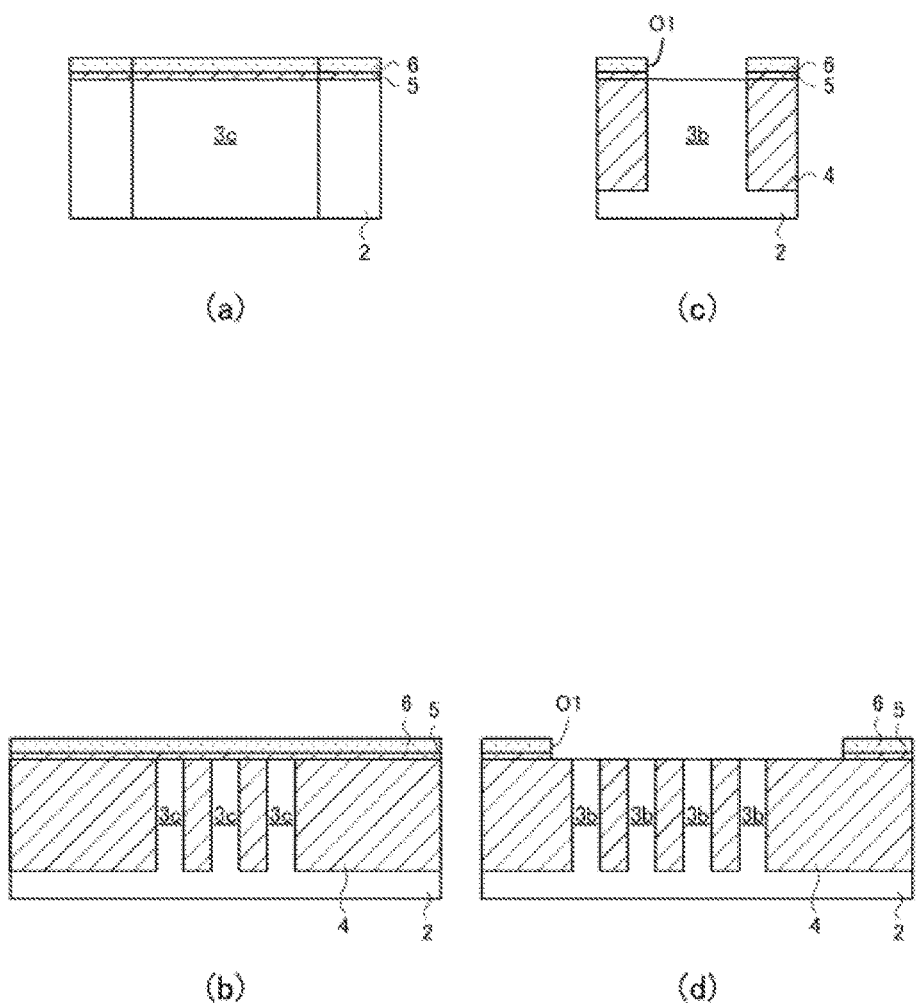
FIGS. 6(a) and (b) are cross-sectional views of the semiconductor device 1, corresponding respectively to the line A-A and the line B-B in FIGS. 5(a), and (c) and (d) are cross-sectional views of the semiconductor device 1, corresponding respectively to the line C-C and the line D-D in FIG. 5(b).
Figure 7:
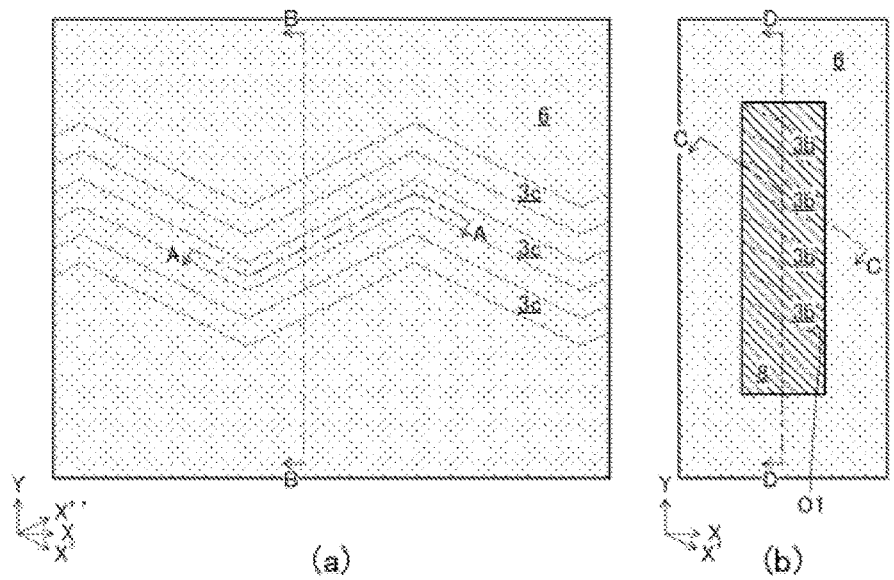
FIGS. 7(a) and (b) are plan views of the semiconductor device 1 as illustrated in FIGS. 1(a) and (b) respectively, during the manufacturing process.
Figure 8:
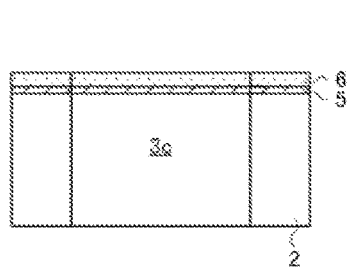
FIGS. 8(a) and (b) are cross-sectional views of the semiconductor device 1, corresponding respectively to the line A-A and the line B-B in FIGS. 7(a), and (c) and (d) are cross-sectional views of the semiconductor device 1, corresponding respectively to the line C-C and the line D-D in FIG. 7(b).
Figure 8:
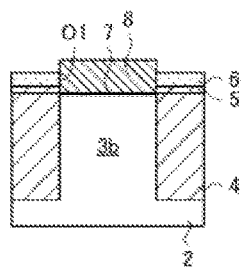
Figure 8:
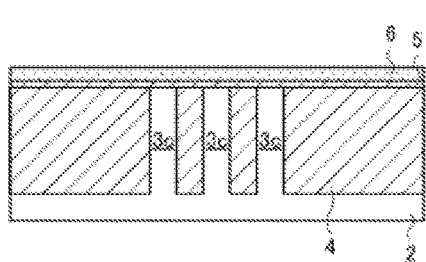
Figure 8:
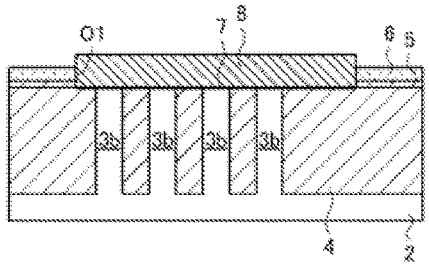
Figure 9:
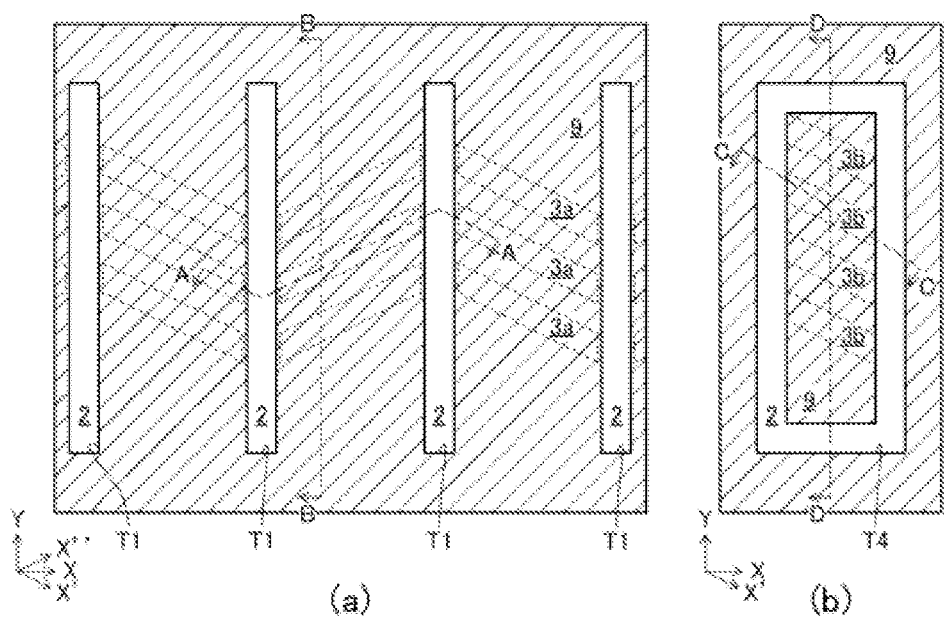
FIGS. 9(a) and (b) are plan views of the semiconductor device 1 as illustrated in FIGS. 1(a) and (b) respectively, during the manufacturing process.
Figure 10:
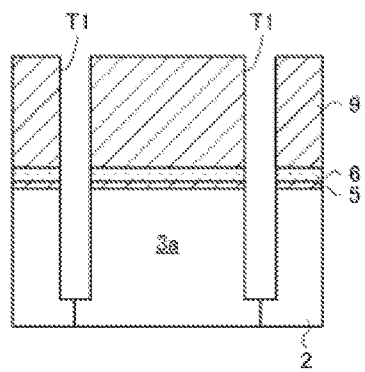
FIGS. 10(a) and (b) are cross-sectional views of the semiconductor device 1, corresponding respectively to the line A-A and the line B-B in FIGS. 9(a), and (c) and (d) are cross-sectional views of the semiconductor device 1, corresponding respectively to the line C-C and the line D-D in FIG. 9(b).
Figure 10:
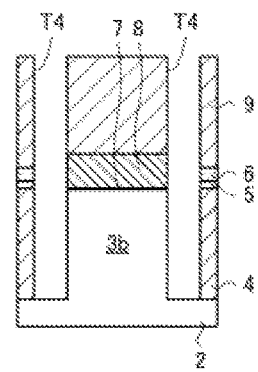
Figure 10:
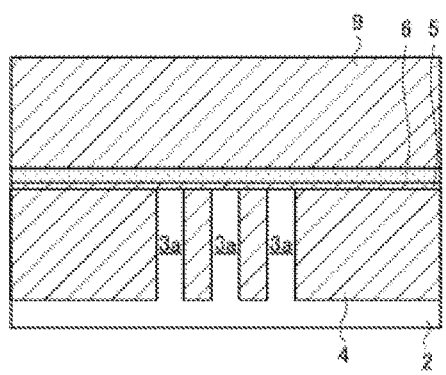
Figure 10:
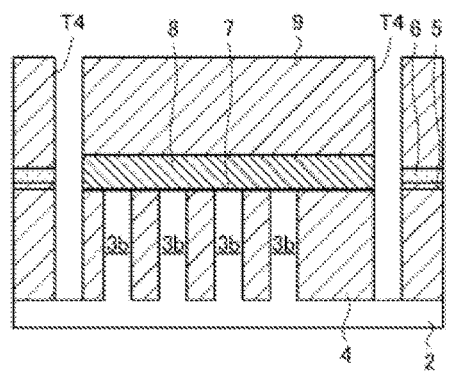
Figure 11:
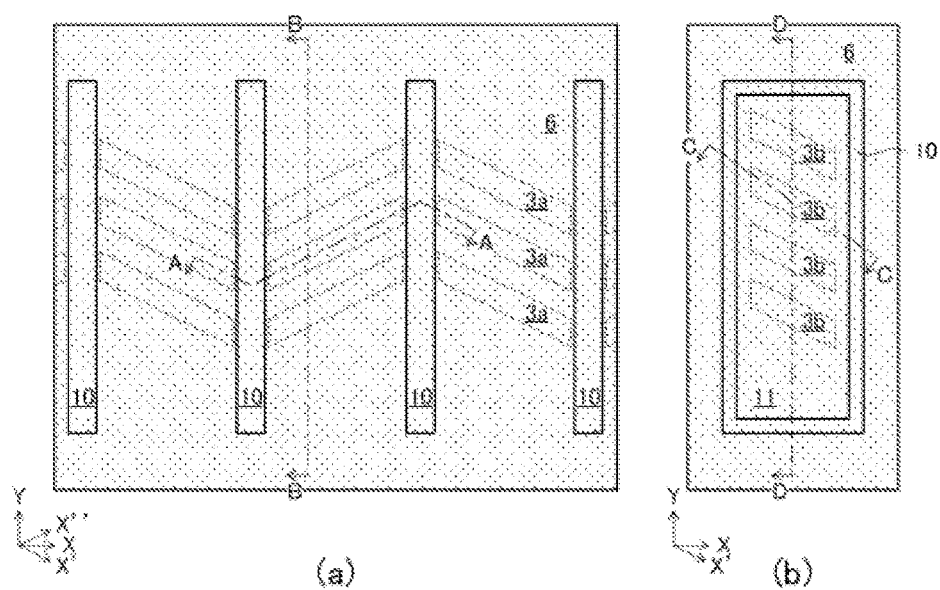
FIGS. 11(a) and (b) are plan views of the semiconductor device 1 as illustrated in FIGS. 1(a) and (b) respectively, during the manufacturing process.
Figure 12:
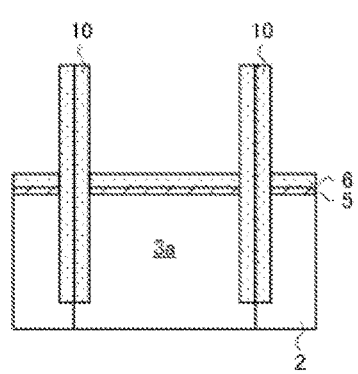
FIGS. 12(a) and (b) are cross-sectional views of the semiconductor device 1, corresponding respectively to the line A-A and the line B-B in FIGS. 11(a), and (c) and (d) are cross-sectional views of the semiconductor device 1, corresponding respectively to the line C-C and the line D-D in FIG. 11(b).
Figure 12:
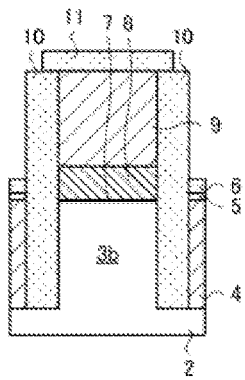
Figure 12:
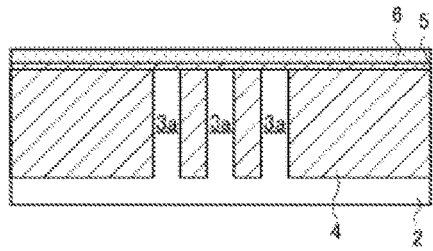
Figure 12:
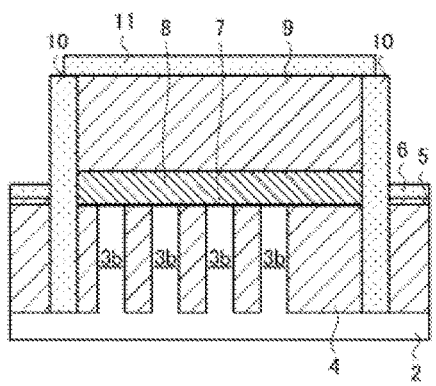
Figure 13:
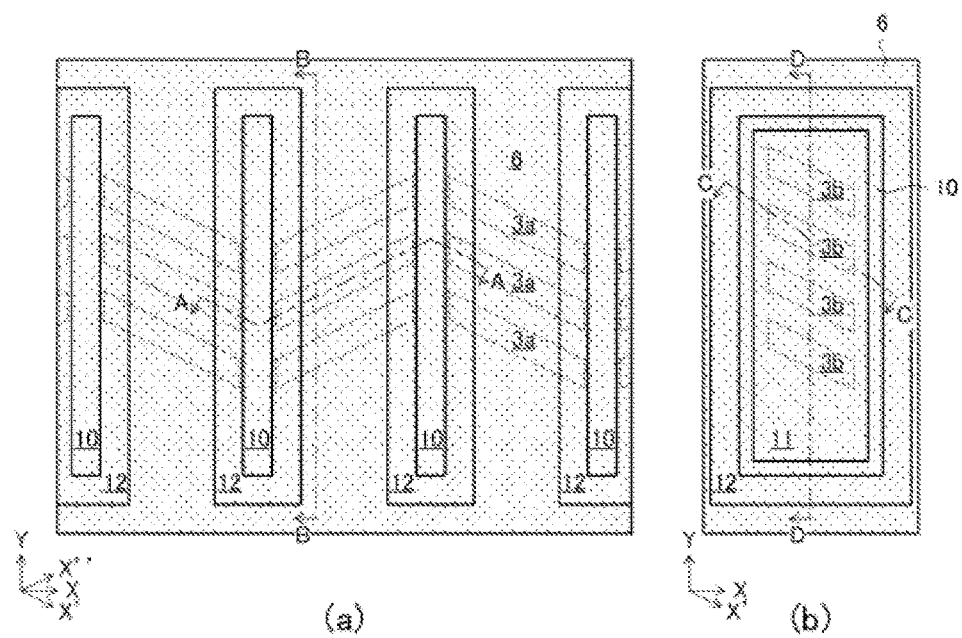
FIGS. 13(a) and (b) are plan views of the semiconductor device 1 as illustrated in FIGS. 1(a) and (b) respectively, during the manufacturing process.
Figure 14:
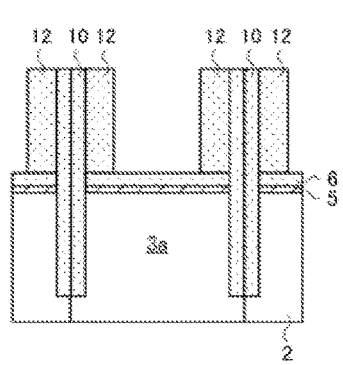
FIGS. 14(a) and (b) are cross-sectional views of the semiconductor device 1, corresponding respectively to the line A-A and the line B-B in FIGS. 13(a), and (c) and (d) are cross-sectional views of the semiconductor device 1, corresponding respectively to the line C-C and the line D-D in FIG. 13(b).
Figure 14:
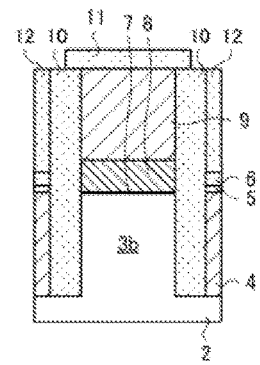
Figure 14:
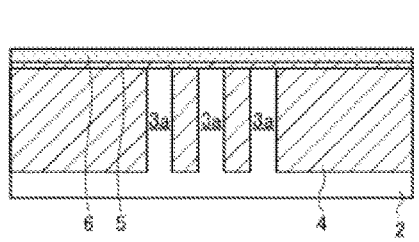
Figure 14:
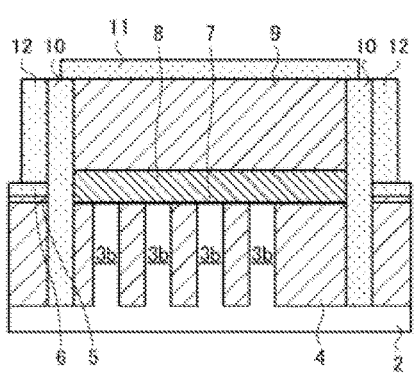
Figure 15:
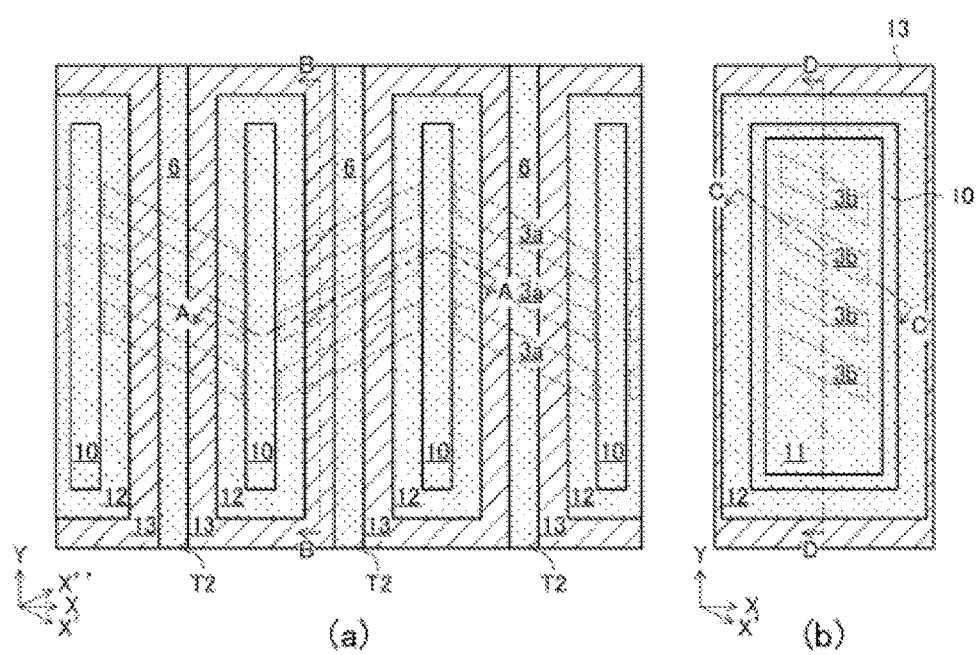
FIGS. 15(a) and (b) are plan views of the semiconductor device 1 as illustrated in FIGS. 1(a) and (b) respectively, during the manufacturing process.
Figure 16:
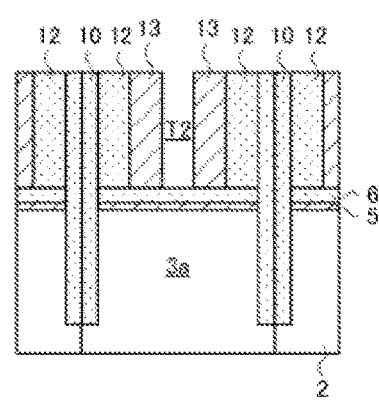
FIGS. 16(a) and (b) are cross-sectional views of the semiconductor device 1, corresponding respectively to the line A-A and the line B-B in FIGS. 15(a), and (c) and (d) are cross-sectional views of the semiconductor device 1, corresponding respectively to the line C-C and the line D-D in FIG. 15(b).
Figure 16:
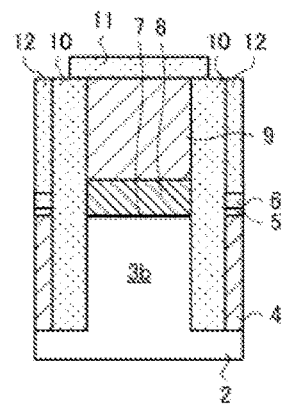
Figure 16:
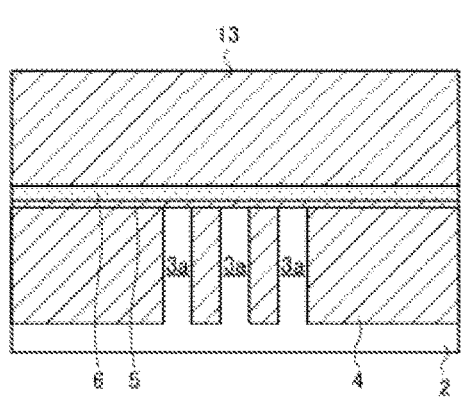
Figure 16:
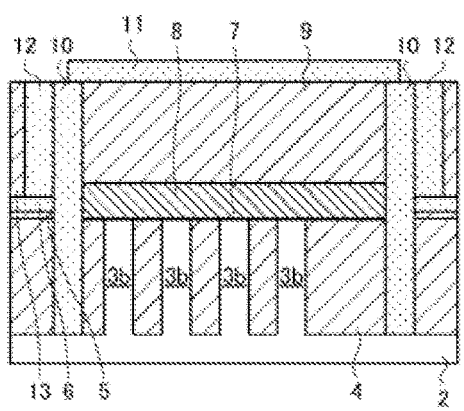
Figure 17:
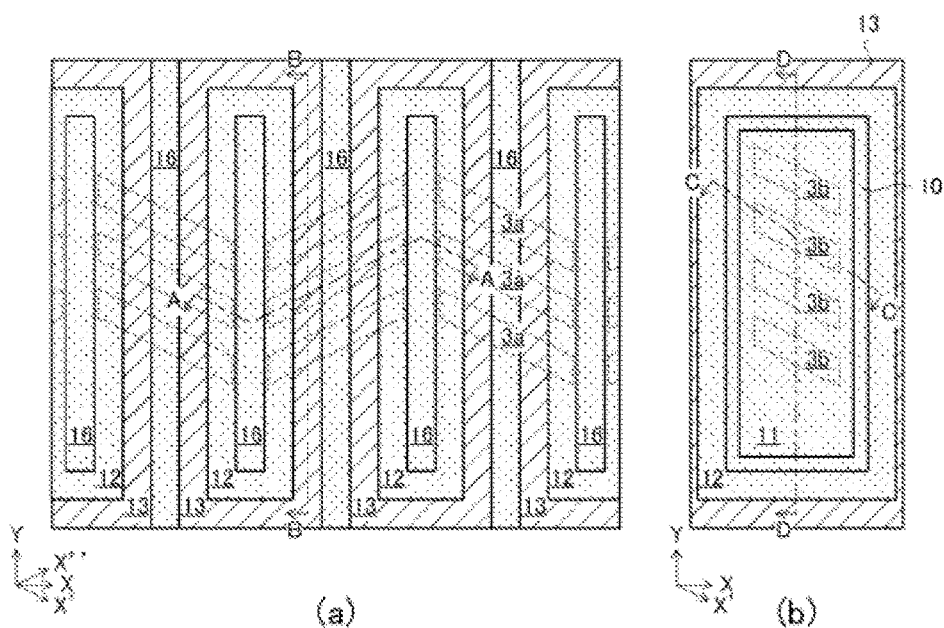
FIGS. 17(a) and (b) are plan views of the semiconductor device 1 as illustrated in FIGS. 1(a) and (b) respectively, during the manufacturing process.
Figure 18:
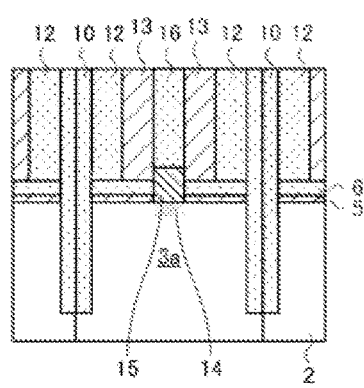
FIGS. 18(a) and (b) are cross-sectional views of the semiconductor device 1, corresponding respectively to the line A-A and the line B-B in FIGS. 17(a), and (c) and (d) are cross-sectional views of the semiconductor device 1, corresponding respectively to the line C-C and the line D-D in FIG. 17(b).
Figure 18:
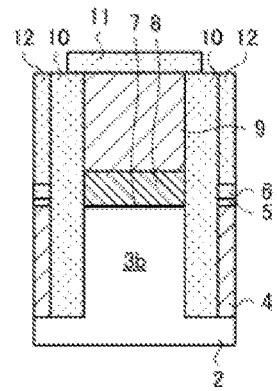
Figure 18:
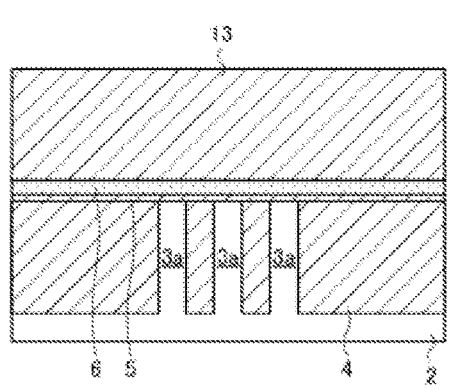
Figure 18:
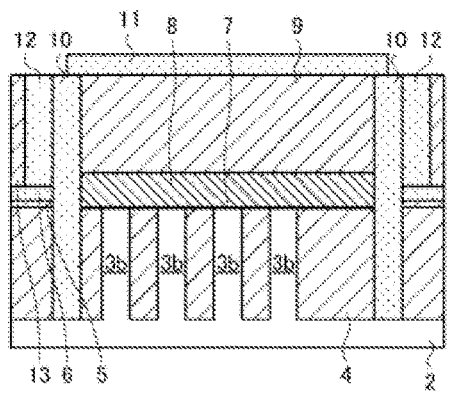
Figure 19:
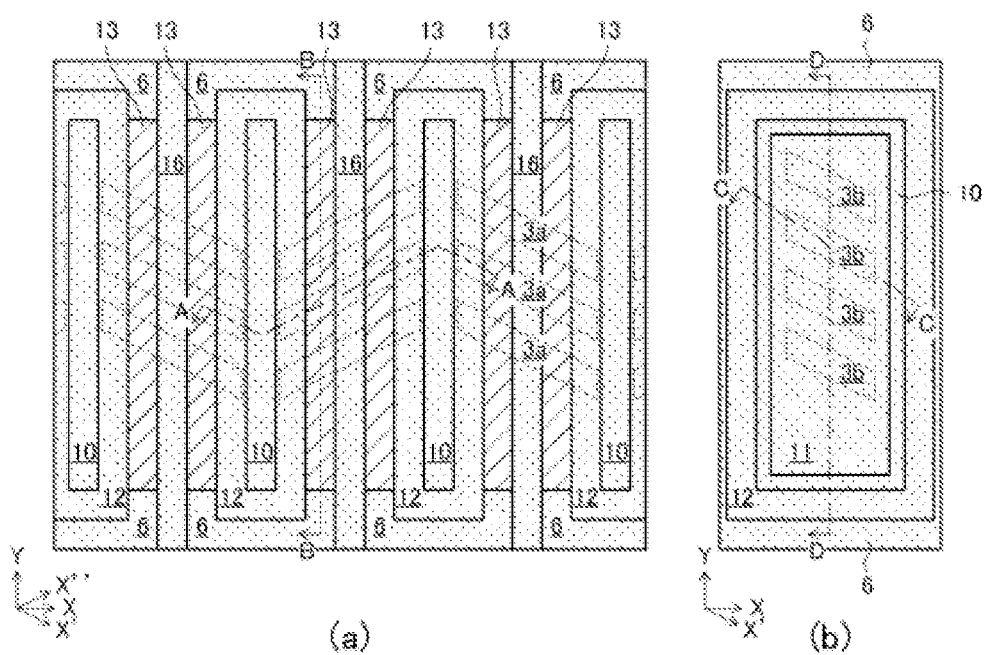
FIGS. 19(a) and (b) are plan views of the semiconductor device 1 as illustrated in FIGS. 1(a) and (b) respectively, during the manufacturing process.
Figure 20:
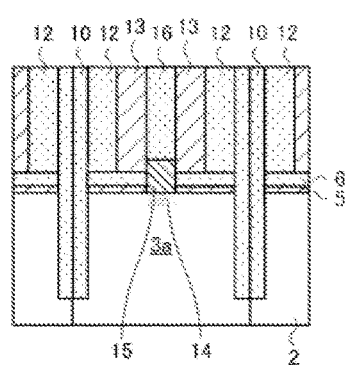
FIGS. 20(a) and (b) are cross-sectional views of the semiconductor device 1, corresponding respectively to the line A-A and the line B-B in FIGS. 19(a), and (c) and (d) are cross-sectional views of the semiconductor device 1, corresponding respectively to the line C-C and the line D-D in FIG. 19(b).
Figure 20:
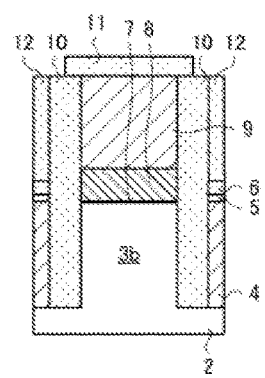
Figure 20:
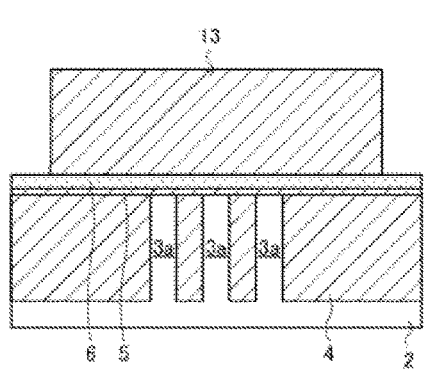
Figure 20:
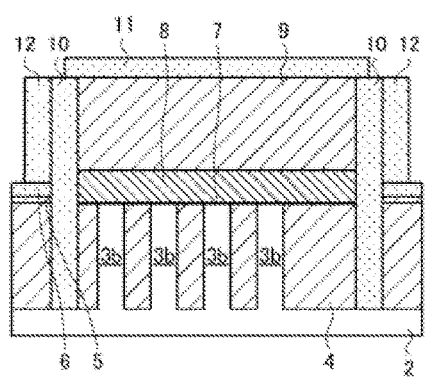
Figure 21:
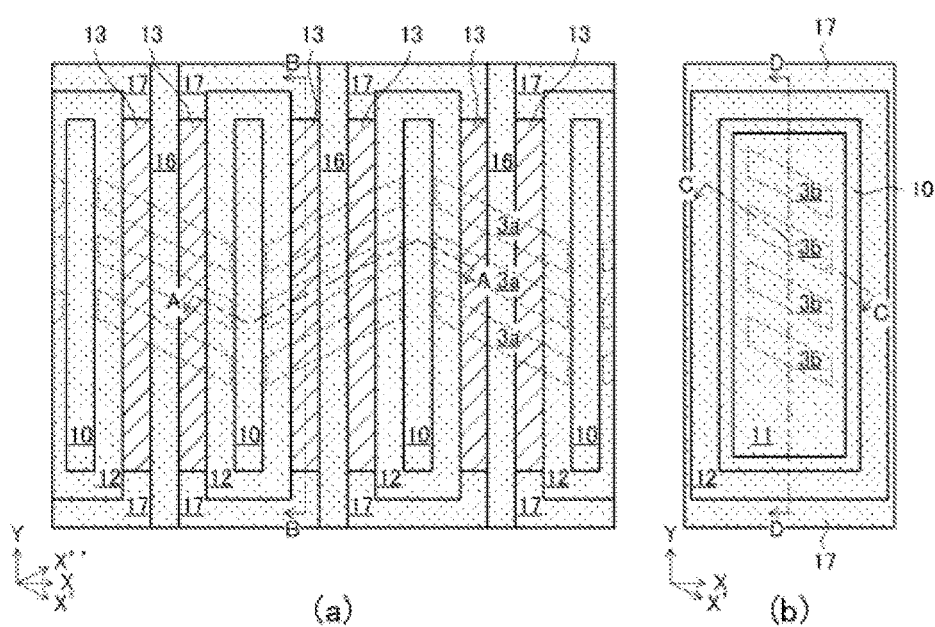
FIGS. 21(a) and (b) are plan views of the semiconductor device 1 as illustrated in FIGS. 1(a) and (b) respectively, during the manufacturing process.
Figure 22:
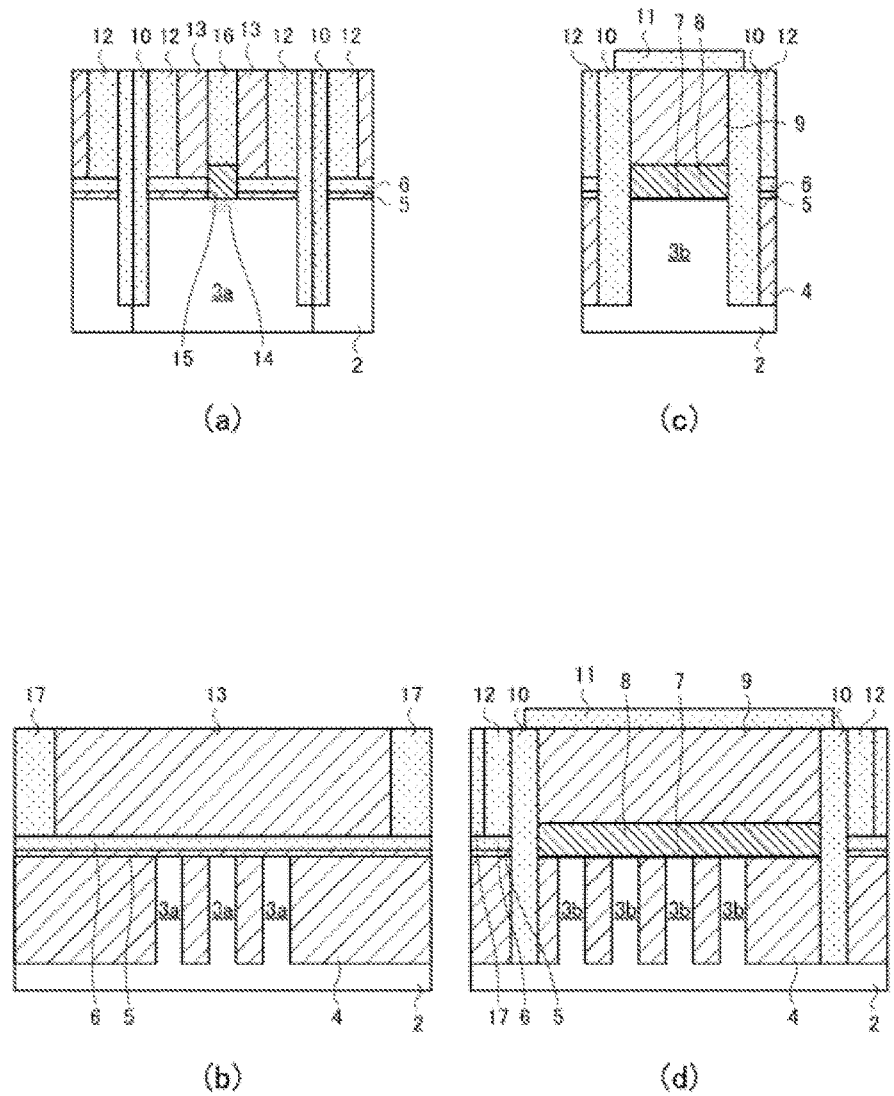
FIGS. 22(a) and (b) are cross-sectional views of the semiconductor device 1, corresponding respectively to the line A-A and the line B-B in FIGS. 21(a), and (c) and (d) are cross-sectional views of the semiconductor device 1, corresponding respectively to the line C-C and the line D-D in FIG. 21(b).

Each word line WL is disposed in such a way as to pass through a series of active regions 3a aligned side-by-side in the Y-direction, with two word lines WL corresponding to one active region 3a. Two cell transistors are disposed in each active region 3a, and the two word lines WL corresponding to each active region 3a form the gate electrodes of the cell transistors. It should be noted that in the example in FIG. 1(a), the width, in the X-direction, of each word line WL, and the separation between the word lines WL in each active region 3a are each equal to the minimum processing dimension F. As illustrated in FIG. 2(a), each word line WL is formed from an embedded word line which is formed by means of a conductive film embedded in the main surface of the semiconductor substrate 2. A gate insulating film 18 is disposed between each word line WL and the semiconductor substrate 2.

The manufacturing method will be discussed in detail hereinafter, but each word line WL (trench T3 discussed hereinafter) is formed in self-alignment relative to the insulating films for element isolation 10. Therefore positional discrepancy between the word lines WL and the insulating films for element isolation 10 does not occur during manufacture, and as a result the separation in the X-direction between each word line WL and the adjacent insulating film for element isolation 10 is a highly-accurate prescribed value. In the example in FIG. 1(a), the prescribed value is the minimum processing dimension F.

Each bit line BL is disposed in such a way as to pass through a series of active regions 3a aligned side-by-side in the X-direction, with one bit line BL corresponding to one active region 3a. In the example in FIG. 1(a), the spacing, in the Y-direction, between adjacent bit lines BL, and the width, in the Y-direction, of each bit line BL are both F.

The structure within the active regions 3a will now be described in detail with reference to FIG. 2(a). As illustrated in the drawing, the insulating films for element isolation 10 are disposed on both sides, in the X-direction, of the active regions 3a. It should be noted that, in the drawing, the insulating film for element isolation 10 toward one end (toward the left in the drawing) in the X-direction is depicted as an insulating film for element isolation $10_1$, and the insulating film for element isolation 10 toward the other end (toward the right in the drawing) in the X-direction is depicted as an insulating film for element isolation $10_2$.

Two word trenches $T3_1$ and $T3_2$ (first and second word trenches) are disposed between the insulating film for element isolation $10_1$ and the insulating film for element isolation $10_2$, and word lines $WL_1$ and $WL_2$ (first and second word lines) are embedded respectively in lower portions of said word trenches $T3_1$ and $T3_2$, with the interposition of gate insulating films 18. It should be noted that the lower surfaces of the word trenches $T3_1$ and $T3_2$ are provided in locations that are higher than the lower surfaces of the insulating films for element isolation 10. Embedded insulating films $20_1$ and $20_2$ are formed respectively on the upper surfaces of the word lines $WL_1$ and $WL_2$. The embedded insulating films $20_1$ and $20_2$ are each formed completely filling the corresponding word trenches $T3_1$ and $T3_2$, and protruding upward from the upper ends of said word trenches $T3_1$ and $T3_2$. As a result, the upper surfaces of the embedded insulating films $20_1$ and $20_2$ exist in locations that are higher than the main surface of the semiconductor substrate 2.

Impurity-diffused layers 14, $24_1$ and $24_2$ (first to third impurity-diffused layers) are formed at the surface of the semiconductor substrate 2 in the active region 3a. More specifically, the impurity-diffused layer 14 is formed between the word line $WL_1$ and the word line $WL_2$, the impurity-diffused layer $24_1$ is formed between the word line $WL_1$ and the insulating film for element isolation $10_1$, and the impurity-diffused layer $24_2$ is formed between the word line $WL_2$ and the insulating film for element isolation $10_2$. The impurity-diffused layers 14 and $24_1$ respectively form one and the other of the source and the drain of a cell transistor in which the word line $WL_1$ serves as the gate electrode. Further, the impurity-diffused layers 14 and $24_2$ respectively form one and the other of the source and the drain of a cell transistor in which the word line $WL_2$ serves as the gate electrode.

A bit line contact plug 15 is provided above the impurity-diffused layer 14. The bit line contact plug 15 is formed in such a way as to be sandwiched between the embedded insulating films $20_1$ and $20_2$, and the bit line contact plug 15 is in contact at its lower surface with the corresponding impurity-diffused layer 14. The corresponding bit line BL passes above the bit line contact plug 15. The bit line BL is in contact at its lower surface with the bit line contact plugs 15 within each active region 3a through which said bit line BL passes. By means of the structure described hereinabove, the bit line BL is connected in common to the impurity-diffused layers 14 in each active region 3a through which said bit line BL passes. A bit mask film 22, which is a silicon nitride film, is formed on the upper surface of the bit line BL, and side-wall insulating films 23, which are silicon nitride films in the shape of side walls, cover the side surfaces of the bit mask film 22 and the bit line BL.

The main surface of the semiconductor substrate 2 is covered by an interlayer insulating film 30 (silicon dioxide film) having an upper surface which is located higher than the upper surface of the bit mask film 22, and the upper surface of the interlayer insulating film 30 is further covered by a stopper film 31, which is a silicon nitride film. Capacitor contact plugs 25 corresponding to each of the impurity-diffused layers $24_1$ and $24_2$ are provided in the interlayer insulating film 30. Each capacitor contact plug 25 penetrates vertically through the interlayer insulating film 30, and the lower surface of each capacitor contact plug 25 is connected to the corresponding impurity-diffused layer. Further, cell capacitors C are disposed corresponding to each of the impurity-diffused layers $24_1$ and $24_2$, above the interlayer insulating film 30. Each cell capacitor C is formed from a lower electrode 35, one for each cell capacitor C, and a capacitative insulating film 34 and an upper electrode 33 which are common to all the cell capacitors C. The lower electrode 35 of each cell capacitor C penetrates through the stopper film 31 and is in contact with the upper surface of the corresponding capacitor contact plug 25. Further, the lower electrodes 35 of each of two cell capacitors C adjacent to one another in the X-direction are coupled to one another by means of a collapse-preventing support film 36 (silicon nitride film). The upper electrode 33 is covered by an embedded conductor film 37, the upper surface of which is planarized, and a plate electrode 38 is disposed on the upper surface of the embedded conductor film 37.

An interlayer insulating film 39 is formed on the upper surface of the plate electrode 38, and a wiring line 41 comprising a metal film is formed on the upper surface of the interlayer insulating film 39. The plate electrode 38 and the wiring line 41 are connected to one another by means of a contact plug 40 which penetrates through the interlayer insulating film 39.

The operation of a cell transistor will now be described, taking by way of example the cell transistor in which the word line $WL_1$ serves as the gate electrode. The cell transistor in which the word line $WL_2$ serves as the gate electrode operates in the same way, but a detailed description thereof is omitted.

If the word line $WL_1$ is activated, a channel is generated between the impurity-diffused layer 14 and the impurity-diffused layer $24_1$. In other words, the cell transistor in which the word line $WL_1$ serves as the gate electrode is turned on, and as a result conduction occurs between the corresponding bit line BL and the lower electrode 35 of the corresponding cell capacitor C, and it is therefore possible to access the cell capacitor C by way of the bit line BL.

Meanwhile, if the word line $WL_1$ becomes inactive, the channel between the impurity-diffused region 14 and the impurity-diffused region $24_1$ ceases to exist. In other words, the cell transistor in which the word line $WL_1$ serves as the gate electrode is turned off, and as a result the corresponding bit line BL and the lower electrode 35 of the corresponding cell capacitor C become electrically isolated, and it is therefore impossible to access the cell capacitor C by way of the bit line BL.

The structures within the peripheral circuit region will next be described with reference to FIG. 1(b). As illustrated in the drawing, a plurality of active regions 3b (second active regions) are disposed in the peripheral circuit region. In practice there is a wide variety in the number of transistors provided in one active region 3b, the shape of the active regions 3b, and the like, but here an example is presented in which one transistor is provided in one active region 3b, and the shape of each active region 3b is a parallelogram in which one group of opposing sides is parallel to the Y-direction, and the other group of opposing sides is parallel to the X'-direction. Further, in this example four active regions 3b are disposed at equal intervals in the Y-direction. Such active regions 3b are regions in which transistors are formed, the bit lines BL, for example, serving as gate electrodes of said transistors, and the following description is predicated on this example.

Each active region 3b is demarcated by the insulating films for element isolation 4, extending in the X-direction, and the insulating films for element isolation 10, extending in the Y-direction. These are the same as the insulating films for element isolation provided in the memory cell region. The planar shape of the insulating films for element isolation 10 is an empty quadrilateral, and four active regions 3b are disposed inside said empty quadrilateral. Both ends, in the X-direction, of each active region 3b are demarcated by the insulating films for element isolation 10. Meanwhile, both ends, in the Y-direction, of each active region 3b are demarcated by the insulating films for element isolation 4. In the example in FIG. 1(b), the spacing between the insulating films for element isolation 10 adjacent to one another in the X-direction is 3F, and therefore the width, in the X-direction, of each active region 3b is 3F. Further, although not shown in the drawing, the spacing between the insulating films for element isolation 4 adjacent to one another in the Y-direction is F, to match the width of the bit lines BL, and therefore the width, in the Y-direction, of the active regions 3b is F. Further, the width, in the Y-direction, of the insulating films for element isolation 4 between the active regions 3b is F to match the spacing between the bit lines BL, and therefore the spacing between the active regions 3b adjacent to one another in the Y-direction is F.

The plurality of bit lines BL which pass through the memory cell region extend to the peripheral circuit region. The four active regions 3b illustrated in FIG. 1(b) each correspond to a mutually different bit line BL, and therefore four bit lines BL are illustrated in FIG. 1(b). Each bit line BL also extends in the X-direction in the peripheral circuit region, and the widths and spacings of the bit lines BL in the peripheral circuit region are all equal to the minimum processing dimension F, as mentioned hereinabove.

The structure within the active regions 3b will now be described in detail with reference to FIG. 2(c). Impurity-diffused layers 50 are provided at the surface of the semiconductor substrate 2 corresponding to both ends, in the X-direction, of the active regions 3b. Further, the surface of the semiconductor substrate 2 corresponding to the center, in the X-direction, of the active region 3b is covered by a conductive film 8, with the interposition of a gate insulating film 7. By this means, one planar MOS transistor (peripheral circuit transistor) is formed in each active region 3b, the conductive film 8 serving as a gate electrode, and the impurity-diffused layers 50 at both sides thereof serving as the source and the drain.

The bit line BL is disposed on the upper surface of the conductive film 8, and the bit line BL and the conductive film 8 are in contact with one another. A bit mask film 22 is formed on the upper surface of the bit line BL, in the same way as in the memory cell region, and side-wall insulating films 23 cover the side surfaces of the bit mask film 22, the bit line BL and the gate insulating film 7.

Contact plugs 51 for each impurity-diffused layer 50 are also provided in the interlayer insulating film 30 discussed hereinabove. The contact plugs 51 penetrate vertically through the interlayer insulating film 30, and the lower surface of each contact plug 51 is connected to the corresponding impurity-diffused layer 50. Contact pads 53 for each contact plug 51 are formed on the upper surface of the interlayer insulating film 30. The lower surface of each contact pad 53 is in contact with the upper surface of the corresponding contact plug 51, and the upper surface of each contact pad 53 is covered by a protective silicon nitride film 54. As illustrated in FIG. 2(c), in the peripheral circuit region the interlayer insulating film 39 is formed directly on the upper surface of the stopper film 31. However, the location of the upper surface of the interlayer insulating film 39 is the same as in the memory cell region. The contact pads 53 are connected by way of contact plugs 55, which penetrate through the interlayer insulating films 39 and 31 and the silicon nitride film 54, to wiring lines 41 formed on the upper surface of the interlayer insulating film 39.

The operation of the peripheral circuit transistors will now be described. If the bit line BL is activated, a channel is generated between the corresponding two impurity-diffused regions 50. The peripheral circuit transistor thus turns on, and conduction occurs between the two wiring lines 41 corresponding to each of the two impurity-diffused layers 50. Meanwhile, if the bit line BL becomes inactive, the channel between the corresponding two impurity-diffused regions 50 ceases to exist. The peripheral circuit transistor thus turns off, and the two wiring lines 41 corresponding to each of the two impurity-diffused layers 50 become electrically isolated.

As described hereinabove, according to the semiconductor device 1 in this mode of embodiment, each word line WL is formed in self-alignment relative to the insulating films for element isolation 10, and positional discrepancy does not occur between the word lines WL and the insulating films for element isolation 10, and therefore the widths, in the X-direction, of each of the impurity-diffused layers $24_1$ and $24_2$ are equal, to a high degree of accuracy. Satisfactory electrical characteristics can therefore be obtained.

A method of manufacturing the semiconductor device 1 will now be described in detail with reference to FIG. 3 to FIG. 28.

First, as illustrated in FIGS. 3(a) and (b) and FIGS. 4(a) to (d), insulating films for element isolation 4 (first insulating films for element isolation) are embedded into the main surface of a semiconductor substrate 2 comprising a p-type silicon single crystal, to form a plurality of active regions 3c in a memory cell region and to form a plurality of active regions 3b in a peripheral circuit region. It should be noted that the plurality of active regions 3c is regions (provisional active regions) which will subsequently become the active regions 3a discussed hereinabove, and they are disposed in a repeating manner at equal intervals in the Y-direction. Each individual active region 3c has a shape in which the active regions 3a (see FIG. 1(a)) that are adjacent to one another in the X-direction are connected to one another, and the active regions 3c extend, overall, in the X-direction while turning in the X'-direction and the X"-direction.

The insulating films for element isolation 4 should be embedded in the following manner. To elaborate, first a masking film, which is not shown in the drawings, is formed on the main surface of the semiconductor substrate 2, and trenches for element isolation are formed by dry etching the main surface of the semiconductor substrate 2 using the masking film as a mask. A silicon dioxide film is then formed by CVD (Chemical Vapor Deposition) to a thickness that completely fills the trenches, after which the masking film and the silicon dioxide film formed above the main surface of the semiconductor substrate 2 are removed by CMP (Chemical Mechanical Polishing) or the like, thereby completing the insulating films for element isolation 4 embedded in the main surface of the semiconductor substrate 2. It should be noted that in the example described here, the insulating films for element isolation 4 are formed using silicon dioxide films, but as discussed hereinabove, it is also possible to form the insulating films for element isolation 4 using silicon nitride films.

Next, as illustrated in FIGS. 5(a) and (b) and FIGS. 6(a) to (d), a pad oxide film 5, which is a silicon dioxide film having a thickness of 5 nm, and a masking film 6, which is a silicon nitride film having a thickness of 10 nm, are successively deposited over the entire surface. An opening portion O1, at the bottom surface of which the plurality of active regions 3b is exposed, is then provided in the pad oxide film 5 and the masking film 6 by photolithography and dry etching, using a masking film, which is not shown in the drawings, as a mask. It should be noted that the masking film used here is removed after the opening portion O1 has been completed.

Next, as illustrated in FIGS. 7(a) and (b) and FIGS. 8(a) to (d), thermal oxidation is used to form gate insulating films 7 (second gate insulating films) on the main surfaces of the semiconductor substrate 2 that are exposed at the bottom surface of the opening portion O1. The gate insulating films 7 formed in this way are silicon dioxide films. A conductive film 8 (third conductive film) which fills the opening portion O1 and which has an upper surface in a location higher than the upper surface of the masking film 6 is then formed by CVD. More specifically, a silicon film (conductive film) containing an impurity is deposited to a thickness at least equal to a thickness that fills the opening portion O1, after which photolithography and dry etching are used to remove the silicon film formed in regions that do not overlap the opening portion O1 as seen in a plan view. In this way it is possible to achieve a state in which the conductive film 8 protrudes from the upper surface of the masking film 6, as illustrated in FIGS. 8(c) and (d).

After the conductive film 8 has been formed, a sacrificial film 9, which is a silicon dioxide film having a thickness of 250 nm, is deposited over the entire surface using CVD. Trenches T1 and T4 (first and fourth trenches) are then first provided in the sacrificial film 9 by photolithography and anisotropic dry etching. The trenches T1 are formed in locations in which the insulating films for element isolation 10 (see FIG. 1(a)) in the memory cell region are to be formed. Meanwhile, the trenches T4 are formed in locations in which the insulating films for element isolation 10 (see FIG. 1(b)) in the peripheral circuit region are to be formed. The trenches T4 are more specifically provided along the outer edges of the conductive film 8. In this way, the masking film 6 and the pad oxide film 5 are made not to exist in the regions inside the trenches T4.

The masking film 6, the pad oxide film 5 and the semiconductor substrate 2 are then successively etched by anisotropic dry etching, using the sacrificial film 9 as a mask. In this way the trenches T1 and T4 are completed, extending as far as the interior of the semiconductor substrate 2, as illustrated in FIGS. 9(a) and (b) and FIGS. 10(a) to (d). It should be noted that because the sacrificial film 9 and the pad oxide film 5 are both silicon dioxide films, the sacrificial film 9 is also etched when the pad oxide film 5 is etched. However, because the thickness of the sacrificial film 9, namely 250 nm, is sufficiently greater than the pad oxide film 5, namely 5 nm, a sufficient amount of the sacrificial film 9 remains after the pad oxide film 5 has been etched.

After the trenches T1 and T4 have been formed, a silicon nitride film having a thickness that fills the trenches T1 and T4 is deposited by carrying out CVD while the sacrificial film 9 remains in place, as illustrated in FIGS. 11(a) and (b) and FIGS. 12(a) to (d). Of the silicon nitride film deposited at this time, the parts that are formed inside the trenches T1 and T4 form the insulating films for element isolation 10 (second insulating films for element isolation) discussed hereinabove. Meanwhile, with regard to the parts that are also formed on the upper surface of the sacrificial film 9, photolithography and dry etching are used to remove all but the parts formed in the region surrounded by the trenches T4. The silicon nitride film remaining on the upper surface of the sacrificial film 9 in this way is a covering film 11 which covers the region surrounded by the trenches T4. The sacrificial film 9 is then removed by removing the silicon dioxide film selectively using wet etching, as illustrated in FIGS. 11(a) and (b) and FIGS. 12(a) to (d). At this time, because the part of the sacrificial film 9 formed in the region surrounded by the trenches T4 is surrounded by the covering film 11 and the insulating films for element isolation 10, which are silicon nitride films, said part of the sacrificial film 9 remains without being removed. The insulating films for element isolation 10 after the sacrificial film 9 has been removed form wall-shaped films which protrude from the surface of the masking film 6.

Next, as illustrated in FIGS. 13(a) and (b) and FIGS. 14(a) to (d), side-wall insulating films 12 (first side-wall insulating films) are formed covering the parts of the insulating films for element isolation 10 that protrude from the surface of the masking film 6. It is preferable to employ CVD deposition and etch-back as a specific method for forming the side-wall insulating films 12. A silicon nitride film is used as the material for the side-wall insulating films 12, and the deposition quantity is set in such a way that the film thickness in the lateral direction after etch-back is F (see FIG. 1(a)). The planar shape of the side-wall insulating films 12 formed in this way is a quadrilateral surrounding the insulating films for element isolation 10, as illustrated in FIGS. 13(a) and (b).

Next, as illustrated in FIGS. 15(a) and (b) and FIGS. 16(a) to (d), side-wall insulating films 13 (second side-wall insulating films) are formed covering the side surfaces of the side-wall insulating films 12. It is preferable to employ CVD deposition and etch-back as a specific method for forming the side-wall insulating films 13, in the same way as for the side-wall insulating films 12. Further, in the same way as for the side-wall insulating films 12, the deposition quantity of the side-wall insulating films 13 is set in such a way that the film thickness in the lateral direction after etch-back is F (see FIG. 1(a)). Meanwhile, unlike the side-wall insulating films 12, silicon dioxide films are used as the material for the side-wall insulating films 13. The planar shape of the side-wall insulating films 13 formed in this way is a quadrilateral surrounding the side-wall insulating films 12, as illustrated in FIGS. 15(a) and (b). By forming the side-wall insulating films 13 in this way, trenches T2 (second trenches) extending in the Y-direction are formed between the active regions 3a adjacent to one another in the X-direction.

Next, the masking films 6 exposed at the bottom surfaces of the trenches T2, and the pad oxide films 5 below said masking films 6, are removed by covering the parts other than the trenches T2 using a photoresist and then performing wet etching. The main surface of the semiconductor substrate 2 is thus exposed at the bottom surfaces of the trenches T2. N-type impurity-diffused layers 14 (first impurity-diffused layers) are then formed in the exposed parts of the main surface of the semiconductor substrate 2 (the parts located below the trenches T2), as illustrated in FIGS. 17(a) and (b) and FIGS. 18(a) to (d). The impurity-diffused layers 14 should be formed by implanting impurity ions. Bit line contact plugs 15 (second conductive films) are then embedded into lower portions of the trenches T2 by employing CVD to deposit a silicon film (conductive film) containing an impurity, and then performing etch-back. Further, cap insulating films 16 are formed on the upper surfaces of the bit line contact plugs 15 by employing CVD to deposit a silicon nitride film, and then performing etch-back. The cap insulating films 16 formed in this way are insulating films which fill the trenches T2.

A photoresist is then used to cover only the regions in the memory cell region overlapping the insulating films for element isolation 10 as viewed in the Y-direction, and the silicon dioxide film in other regions is selectively removed by dry etching. Both end portions, in the Y-direction, of the side-wall insulating films 13 are thus first removed in the memory cell region, as illustrated in FIGS. 19(a) and (b) and FIGS. 20(a) to (d). As a result, the side-wall insulating films 13 formed on one side, in the X-direction, of the side-wall insulating films 12, and the side-wall insulating films 13 formed on the other side thereof in the X-direction are isolated from one another. Further, all the side-wall insulating films 13 in the peripheral circuit region are removed. The masking film 6 is exposed in the regions in which the side-wall insulating films 13 have been removed.

The spaces created by removing the side-wall insulating films 13 are then filled by embedding films 17, which are silicon nitride films, as illustrated in FIGS. 21(a) and (b) and FIGS. 22(a) to (d). More specifically, a silicon nitride film is deposited by CVD, after which the silicon nitride film is selectively etched using dry etching until the upper surfaces of the side-wall insulating films 13 are exposed. This completes the embedding films 17.

The side-wall insulating films 13 are then removed by selectively etching the silicon dioxide films, and then the masking films 6, the pad oxide films 5 and the semiconductor substrate 2 below the side-wall insulating films 13 are successively etched to form trenches T3 in the locations in which the side-wall insulating films 13 had been, as illustrated in FIGS. 23(a) and (b) and FIGS. 24(a) to (d). It should be noted that the masking films 6 are preferably etched under conditions whereby silicon nitride films are selectively removed, but in this case the upper surfaces of the insulating films for element isolation 10, the side-wall insulating films 12, the cap insulating films 16 and the embedding films 17 are also etched. Subsequent steps require that these films remain, and therefore the thicknesses of the insulating films for element isolation 10, the side-wall insulating films 12, the cap insulating films 16 and the embedding films 17 must be set in advance in such a way that said films remain after the masking films 6 have been removed in this step.

After the trenches T3 have been formed, word lines WL are then formed inside said trenches T3, as illustrated in FIGS. 25(a) and (b) and FIGS. 26(a) to (d). More specifically, gate insulating films 18 (first gate insulating films) covering the inner surfaces of the trenches T3 are first formed by thermal oxidation. Interposed layers 19a, which are titanium nitride films covering the gate insulating films 18, and tungsten films 19b are then deposited successively by CVD, and the interposed layers 19a and the tungsten films 19b are then etched by dry etching in such a way that their upper surfaces are at the same height inside the trenches T3. In this way, conductive films 19 (first conductive films), which are laminated films comprising the interposed layers 19a and the tungsten films 19b, are formed in the lower portions of the trenches T3. The conductive films 19 formed in this way are the word lines WL (first wiring lines) which extend in the Y-direction. It should be noted that in other drawings (FIGS. 2(a) and (b), for example), the word lines WL are depicted as single films, but this is a result of placing priority on clarity, and the actual word lines WL are laminated films comprising the interposed layers 19a and the tungsten films 19b, as illustrated in FIGS. 26(a) and (b). After the formation of the word lines WL has been completed, a silicon nitride film is deposited by CVD, thereby filling the interiors of the trenches T3 with embedded insulating films 20, and the upper surfaces of the conductive films 8 and the bit line contact plugs 15 are then exposed by carrying out polishing using CMP.

Next, as illustrated in FIGS. 27(a) and (b) and FIGS. 28(a) to (d), a conductive film 21, which is a tungsten film, is deposited over the entire surface by sputtering, and a bit mask film 22, which is a silicon nitride film, is deposited by plasma CVD. These films are then patterned into the shapes of the bit lines BL by photolithography and dry etching. The conductive films 21 patterned in this way are the bit lines BL, and in the memory cell region the bit lines BL are in contact at their lower surfaces with the bit line contact plugs 15, and in the peripheral circuit region they are in contact at their lower surfaces with the conductive films 8. It should be noted that the bit lines BL may comprise laminated films formed by laminating a plurality of types of conductive film, in the same way as the word lines WL. Further, although here the bit lines BL are in the shape of straight lines, a configuration can also be adopted in which portions of the bit lines BL are curved, for example.

Here, when the conductive films 21 are patterned, the conductive films 8 and the bit line contact plugs 15 are also patterned. As a result, parts of the conductive films 8 and the bit line contact plugs 15 other than the parts formed below the bit lines BL are removed, to expose the insulating films for element isolation 4 and the main surface of the semiconductor substrate 2, as can be understood by comparing FIGS. 25(a) and (b) with FIGS. 27(a) and (b). In this way, in the memory cell region the bit line contact plugs 15 are divided to form one bit line contact plug 15 for each bit line BL. Meanwhile, in the peripheral circuit region, the conductive film 8 is divided to form one conductive film 8 for each bit line BL, and the main surface of the semiconductor substrate 2 at both end portions, in the X-direction, of each active region 3b is exposed.

Side-wall insulating films 23 are then formed on the side surfaces of the bit lines BL and the like, as illustrated in FIGS. 2(a) and (c), by depositing a silicon nitride film and then performing etch-back. Further, impurity-diffused layers $24_1$ and $24_2$ are formed in the memory cell region by removing the pad oxide films 5, the masking films 6 and the side-wall insulating films 12 covering both end portions of the active regions 3a and implanting ions into the exposed main surfaces of the semiconductor substrate 2. Meanwhile, impurity-diffused layers 50 are also formed in the peripheral circuit region by implanting ions into the exposed main surfaces of the semiconductor substrate 2 at both end portions of the active regions 3b. Components in upper layers, such as the cell capacitors C discussed hereinabove, are then fabricated, to complete the semiconductor device 1.

As described hereinabove, according to the method of manufacturing the semiconductor device 1 in this mode of embodiment, the insulating films for element isolation 10 which are self-aligned with the word lines WL can be formed using insulating films (silicon nitride films). It is therefore not necessary to apply a voltage to the element isolation regions, and the circuit can therefore be simplified compared with the background art in which the element isolation regions which are self-aligned with the word lines WL are formed using conductive films.

Figure 24:
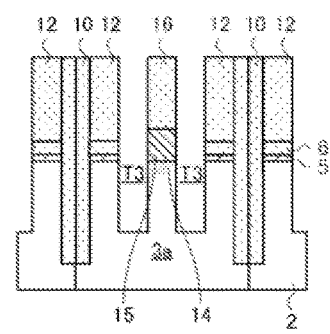
FIGS. 24(a) and (b) are cross-sectional views of the semiconductor device 1, corresponding respectively to the line A-A and the line B-B in FIGS. 23(a), and (c) and (d) are cross-sectional views of the semiconductor device 1, corresponding respectively to the line C-C and the line D-D in FIG. 23(b).
Figure 24:
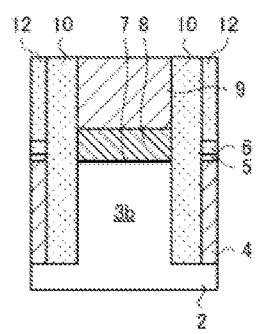
Figure 24:
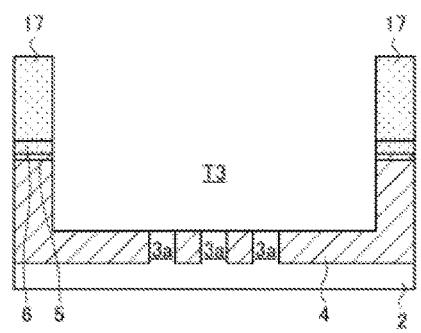
Figure 24:
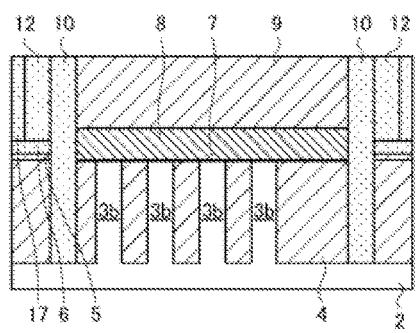
Figure 25:
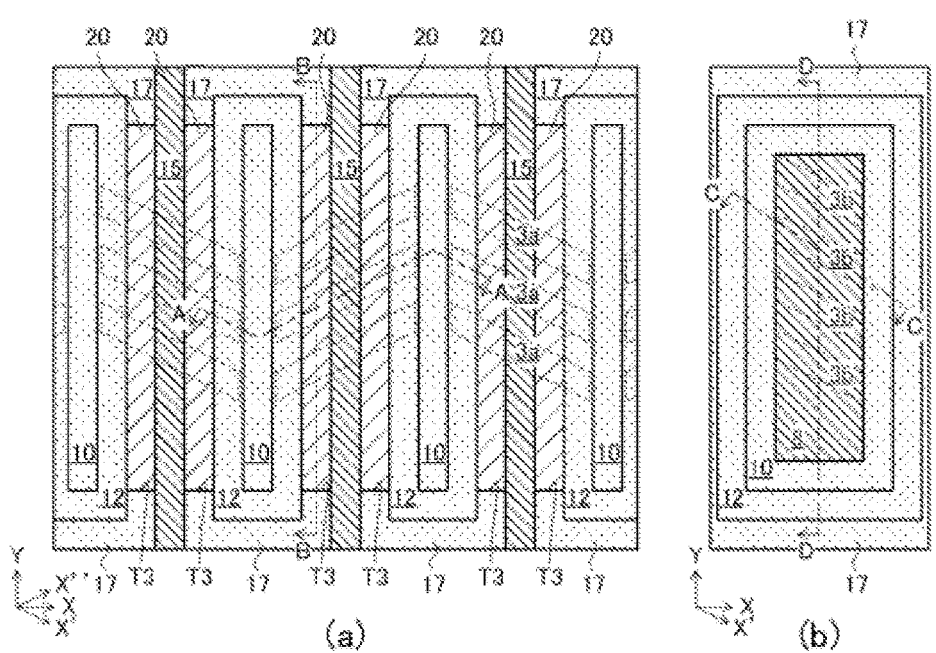
FIGS. 25(a) and (b) are plan views of the semiconductor device 1 as illustrated in FIGS. 1(a) and (b) respectively, during the manufacturing process.
Figure 26:
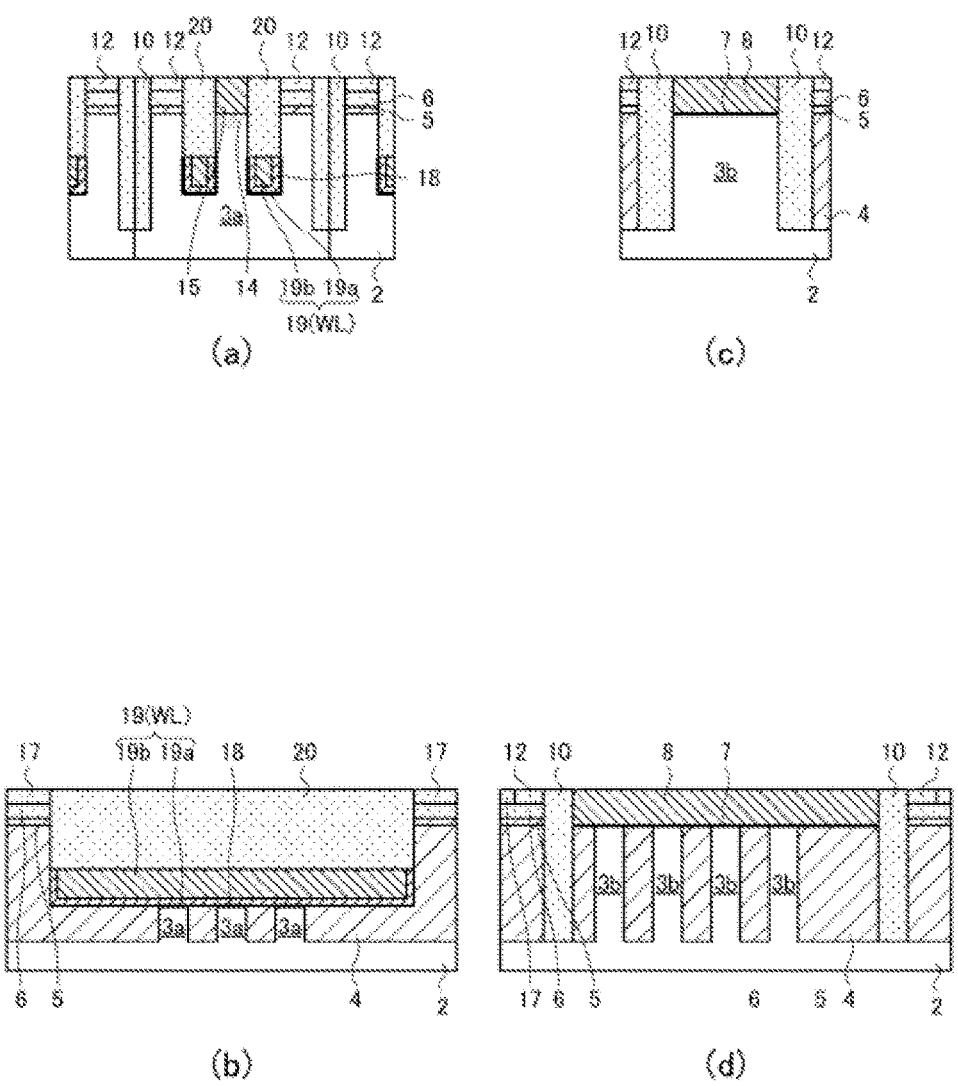
FIGS. 26(a) and (b) are cross-sectional views of the semiconductor device 1, corresponding respectively to the line A-A and the line B-B in FIGS. 25(a), and (c) and (d) are cross-sectional views of the semiconductor device 1, corresponding respectively to the line C-C and the line D-D in FIG. 25(b).
Figure 27:
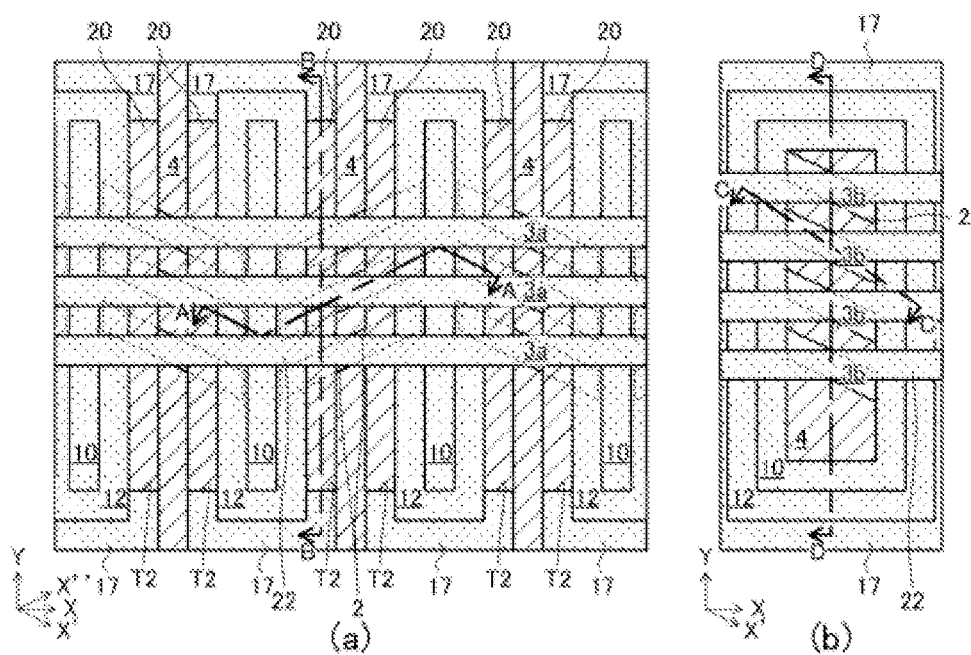
FIGS. 27(a) and (b) are plan views of the semiconductor device 1 as illustrated in FIGS. 1(a) and (b) respectively, during the manufacturing process.
Figure 28:
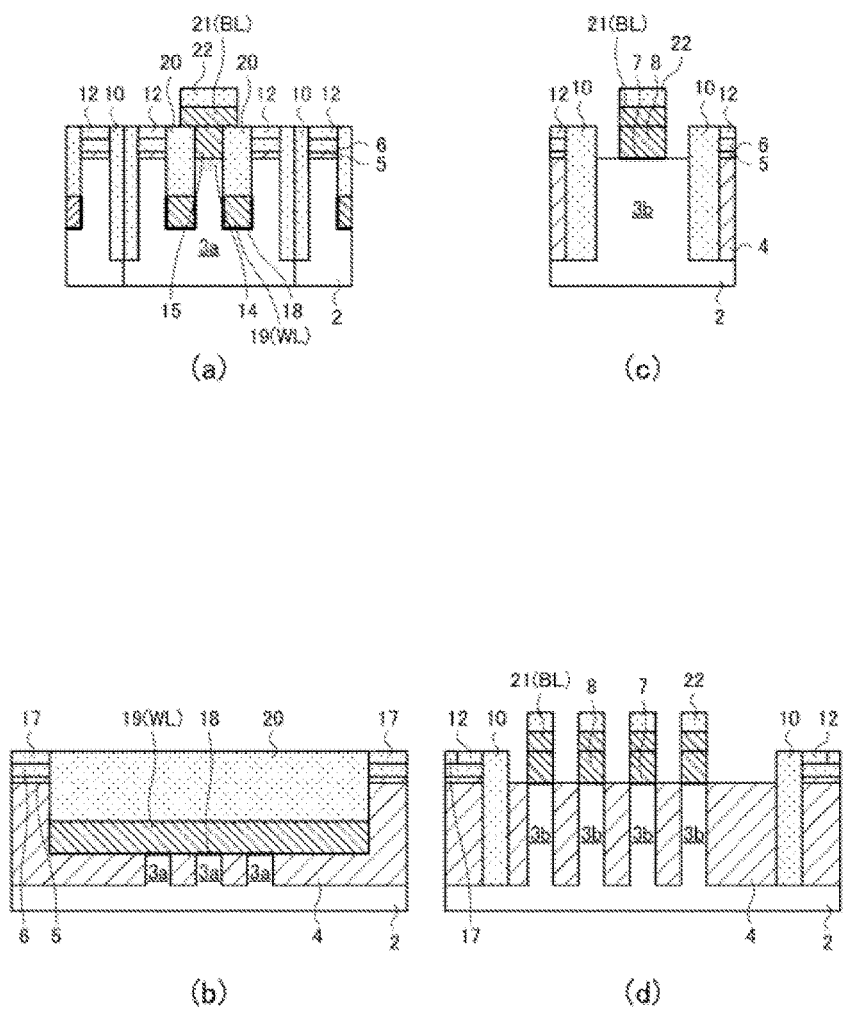
FIGS. 28(a) and (b) are cross-sectional views of the semiconductor device 1, corresponding respectively to the line A-A and the line B-B in FIGS. 27(a), and (c) and (d) are cross-sectional views of the semiconductor device 1, corresponding respectively to the line C-C and the line D-D in FIG. 27(b).

Further, while on the one hand the insulating films for element isolation 10, the cap insulating films 16, the side-wall insulating films 13 and the embedding films 17 are formed using silicon nitride films (a first material), on the other hand the side-wall insulating films 13 are formed using silicon dioxide films (a second material different from the first material), and it is therefore possible to form the trenches T3 for embedding the word lines WL by selectively removing only the side-wall insulating films 13, as illustrated in FIGS. 24 (a) and (c), for example. Further, the masking film 6 comprising a silicon nitride film is formed as a base layer for the sacrificial film 9, and it is therefore possible for the wall-shaped insulating films for element isolation 10 to be suitably formed, as illustrated in FIG. 12(a) for example.

Further, although the masking film 6, which is a silicon nitride film, must be etched when the trenches T3 are being formed, the thicknesses of the insulating films for element isolation 10, the side-wall insulating films 12, the cap insulating films 16 and the embedding films 17 are set in such a way that said films remain after said etching has been completed, and therefore subsequent etching of the semiconductor substrate 2 can be performed using these films as a mask.

Further, according to the method of manufacturing the semiconductor device 1 in this mode of embodiment, the peripheral circuit region can be formed at the same time as the memory cell region, and therefore manufacturing costs can be reduced.

Preferred modes of embodiment of the present invention have been described hereinabove, but various modifications to the present invention may be made without deviating from the gist of the present invention, without limitation to the abovementioned modes of embodiment, and it goes without saying that these are also included within the scope of the present invention.

For example, in the mode of embodiment described hereinabove, the insulating films for element isolation 10, the side-wall insulating films 13, the cap insulating films 16 and the embedding films 17 are formed from silicon nitride films, and the side-wall insulating films 13 are formed from silicon dioxide films, but these films may also be formed from other materials, provided that it is possible to selectively remove only the side-wall insulating films 13 when the trenches T3 are being formed, as illustrated in FIG. 12(a), for example.

Further, as illustrated in FIG. 1(a), in the mode of embodiment described hereinabove, the distances between the insulating films for element isolation 10 and the word lines WL adjacent thereto, the widths, in the X-direction, of the word lines WL, and the distances between the word lines WL in each active region 3a are each equal to the minimum processing dimension F, but the lengths of each part may be values other than the minimum processing dimension F, provided that the distances between the insulating films for element isolation 10 and the word lines WL adjacent thereto are a fixed value. Further, the distances between the insulating films for element isolation 10 and the word lines WL adjacent thereto, the widths of the word lines WL, and the distances between the word lines WL do not need to be the same as one another. These lengths can be controlled by controlling the spacings, in the X-direction, between the trenches T1 (see FIG. 9(a)) for embedding the insulating films for element isolation 10, and the thicknesses, in the lateral direction, of the side-wall insulating films 12 and 13 (see FIG. 15(a)), and can be made to be less than the minimum processing dimension F.

EXPLANATION OF THE REFERENCE CODES

1 Semiconductor device
3a Active region (first active region)
3b Active region (second active region)
3c Active region (provisional active region)
4 Insulating film for element isolation (first insulating film for element isolation)
5 Pad oxide film
6 Masking film
7 Gate insulating film (second gate insulating film)
8 Conductive film (third conductive film)
9 Sacrificial film (sacrificial film)
10, $10_1$, $10_2$ Insulating film for element isolation (second insulating film for element isolation)
11 Covering film
12 Second side-wall insulating film (first side-wall insulating film)
13 Side-wall insulating film (second side-wall insulating film)
14 Impurity-diffused layer (first impurity-diffused layer)
15 Bit line contact plug (second conductive film)
16 Cap insulating film
17 Embedding film
18 Gate insulating film (first gate insulating film)
19 Conductive film (first conductive film)
19a Interposed layer
19b Tungsten film
20, $20_1$, $20_2$ Embedded insulating film
21 Conductive film
22 Bit mask film
23 Side-wall insulating film
$24_1$ Impurity-diffused layer (second impurity-diffused layer)
$24_2$ Impurity-diffused layer (third impurity-diffused layer)
25 Capacitor contact plug
30, 39 Interlayer insulating film
31 Stopper film
33 Upper electrode
34 Capacitative insulating film
35 Lower electrode
36 Support film 37 Embedded conductor film
38 Plate electrode
40, 51, 55 Contact plug
41 Wiring line
50 Impurity-diffused layer
53 Contact pad
54 Silicon nitride film
C Cell capacitor
BL Bit line (second wiring line)
Opening portion
T1 Trench (first trench)
T2 Trench (second trench)
T3 Trench (third trench)
$T3_1$ Trench (first word trench)
$T3_2$ Trench (second word trench)
T4 Trench (fourth trench)
WL Word line (first wiring line)
$WL_1$ Word line (first word line)
$WL_2$ Word line (second word line)

What is claimed is:

1. A semiconductor device comprising:
a semiconductor substrate;
a plurality of first insulating films for element isolation, each of which is embedded in a main surface of the semiconductor substrate and extends in a first direction;
a plurality of second insulating films for element isolation, each of which is embedded in the main surface of the semiconductor substrate and extends in a second direction intersecting the first direction, and which, in conjunction with the plurality of first insulating films for element isolation, demarcate a plurality of first active regions disposed in a matrix formation, wherein the plurality of second insulating films extend to a first vertical height relative to the semiconductor substrate;
first and second word trenches which are provided extending in the second direction in the main surface of the semiconductor substrate, and which are disposed between two of the plurality of second insulating films for element isolation that are adjacent to one another in the first direction;
first and second word lines, embedded respectively in lower portions of the first and second word trenches, with the interposition of gate insulating films;
first and second embedded insulating films disposed respectively over first and second word lines, wherein the first and second embedded insulating films extend to a second vertical height relative to the semiconductor substrate, and the second vertical height is greater than the first vertical height;
first impurity-diffused layers provided between the first word lines and the second word lines;
second impurity-diffused layers provided between the first word lines and one of said two second insulating films for element isolation; and
third impurity-diffused layers provided between the second word lines and the other of said two second insulating films for element isolation;
wherein the first and second word trenches are formed in self-alignment relative to the plurality of second insulating films for element isolation so that a first width between one second insulating film of the plurality of second insulating films and the first word line trench is substantially equal to a second width between another second insulating film of the plurality of second insulating films and the second word trench.

2. The semiconductor device as claimed in claim 1, wherein:
each of the plurality of first insulating films for element isolation is formed from a silicon dioxide film; and
each of the plurality of second insulating films for element isolation is formed from a silicon nitride film.

3. The semiconductor device as claimed in claim 1, comprising:
bit line contact plugs which are in contact, at their lower surfaces, with the first impurity-diffused layers; and
bit lines which are in contact, at their lower surfaces, with the bit line contact plugs.

4. The semiconductor device as claimed in claim 1, comprising:
first and second capacitor contact plugs which are respectively in contact, at their lower surfaces, with the second and third impurity-diffused layers; and
first and second capacitors which are respectively in contact, at their lower surfaces, with the first and second capacitor contact plugs.

* * * * *